(12) United States Patent
Matsuura et al.

(10) Patent No.: US 7,759,730 B2
(45) Date of Patent: Jul. 20, 2010

(54) SEMICONDUCTOR DEVICE AND METHOD OF MANUFACTURING THE SAME

(75) Inventors: Hitoshi Matsuura, Tokyo (JP); Yoshito Nakazawa, Tokyo (JP); Tsuyoshi Kachi, Tokyo (JP); Yuji Yatsuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/463,962

(22) Filed: May 11, 2009

(65) Prior Publication Data

US 2009/0224315 A1 Sep. 10, 2009

Related U.S. Application Data

(62) Division of application No. 11/836,574, filed on Aug. 9, 2007, now Pat. No. 7,544,568.

(30) Foreign Application Priority Data

Aug. 9, 2006 (JP) ............................ 2006-216659

(51) Int. Cl.
 *H01L 27/108* (2006.01)
(52) U.S. Cl. ............... 257/330; 257/288; 257/E27.091; 438/259; 438/270
(58) Field of Classification Search .......... 257/288, 257/330, E27.091; 438/259, 270
See application file for complete search history.

(56) References Cited

U.S. PATENT DOCUMENTS

| | | | |
|---|---|---|---|
| 6,638,850 B1 | 10/2003 | Inagawa et al. | |
| 6,706,604 B2 | 3/2004 | Inagawa et al. | |
| 6,717,210 B2 * | 4/2004 | Takano et al. | 257/330 |
| 6,858,896 B2 * | 2/2005 | Inagawa et al. | 257/332 |
| 6,972,460 B2 | 12/2005 | Aida et al. | |
| 7,042,048 B2 * | 5/2006 | Nakazawa et al. | 257/330 |
| 7,361,557 B2 * | 4/2008 | Inagawa et al. | 438/270 |
| 2006/0261391 A1 * | 11/2006 | Nakazawa et al. | 257/296 |

FOREIGN PATENT DOCUMENTS

| | | |
|---|---|---|
| JP | 2647884 B2 | 5/1997 |
| JP | 2000-196075 A | 7/2000 |
| JP | 2000-277531 A | 10/2000 |
| JP | 2002-246596 A | 8/2002 |
| JP | 2005-005438 A | 1/2005 |

* cited by examiner

*Primary Examiner*—Victor A Mandala
(74) *Attorney, Agent, or Firm*—Miles & Stockbridge P.C.

(57) ABSTRACT

A gate trench 13 is formed in a semiconductor substrate 10. The gate trench 13 is provided with a gate electrode 16 formed over a gate insulating film 14. A portion of the gate electrode 16 protrudes from the semiconductor substrate 10, and a sidewall 24 is formed over a side wall portion of the protruding portion. A body trench 25 is formed in alignment with an adjacent gate electrode 16. A cobalt silicide film 28 is formed over a surface of the gate electrode 16 and over a surface of the body trench 25. A plug 34 is formed using an SAC technique.

5 Claims, 40 Drawing Sheets

US 7,759,730 B2

SEMICONDUCTOR DEVICE AND METHOD OF MANUFACTURING THE SAME

CROSS-REFERENCE TO RELATED APPLICATIONS

This application is a divisional of application Ser. No. 11/836,574 filed Aug. 9, 2007, which is now U.S. Pat. No. 7,544,568. This application also claims priority from Japanese Patent Application No. 2006-216659 filed on Aug. 9, 2006, the disclosure of which, including the specification, drawings, and abstract, is incorporated herein by reference in its entirety.

BACKGROUND OF THE INVENTION

1. Field of the Invention

The present invention relates to semiconductor devices and manufacturing technologies, and more particularly to techniques effective for a power MISFET (Metal Insulator Semiconductor Field Effect Transistor) having a trench gate structure and manufacturing the same.

2. Description of Related Art

Japanese Patent Laid-open Nos. 2000-196075 and 2000-277531 disclose techniques for preventing a source offset by protruding a trench gate electrode from the surface of a semiconductor substrate.

Japanese Patent Laid-open No. 2002-246596 discloses a manufacturing method of a power MISFET in which the cell pitch is reduced by a self-aligned structure. Specifically, it discloses a technique for forming a source region and a body contact region utilizing a sidewall formed on a sidewall portion of a trench gate electrode protruding from a semiconductor substrate.

Japanese Patent Laid-open No. 2005-5438 discloses a technique for turning a gate electrode surface, a source region, and a body contact region into silicide in a self-aligned manner by utilizing a sidewall formed on a side wall portion of a trench gate electrode protruding from a semiconductor substrate.

Japanese Patent No. 2647884 discloses a technique for forming an oxide film formed on the bottom portion of a trench to be thicker than the inner wall of the trench.

As an effective means of obtaining high performance in power MISFETs, shrinkage of the device structure has been advanced. However, the advancement in shrinkage of the device structure is regulated by photolithography technologies in many ways, and currently, it is difficult to achieve miniaturization of the device structure while preventing side effects.

For example, the techniques disclosed in Japanese Patent laid-open Nos. 2000-196075 and Japanese Patent Laid-open No. 2000-277531 require alignment tolerance between the gate electrode and the contact hole for connecting with the source region, and therefore, with these techniques, it is difficult to improve the cell density. The technique disclosed in Japanese Patent Laid-open No. 2002-246596 requires that the insulating film should be processed so as to be left over the gate electrode in order to insulate the gate electrode, which protrudes from the semiconductor substrate, from the source wire coupled to the source region. However, with the structure described in Japanese Patent Laid-open No. 2002-246596, there is a problem that it is impossible to form an insulating film with a stable film thickness over the gate electrode and gate withstand voltage defects become apparent. The technique described in Japanese Patent Laid-open No. 2005-5438 makes heavy use of the technique of forming patterns by a photolithography technology as the manufacturing technology. For example, the formation of the protruding portion of the gate electrode, the formation of the source region and the body contact region, and the formation of the contact hole are implemented by photolithography technology. In this case, there are a range of constraints on miniaturization of the device structure because of problems associated with alignment accuracy in the photolithography technique, so it is considered that there is a limit on miniaturization of the device structure. For this reason, a silicide process is conducted in the technique described in Japanese Patent Laid-open No. 2005-5438. However, it is difficult to advance miniaturization of the device structure to such an extent that the silicide process becomes effective. Thus, it is understood that the conventional techniques have problems in miniaturization of the device structure.

Even if it were possible to achieve the miniaturization of the device structure along the planar direction (horizontal direction) of the semiconductor substrate, there would exist side effects associated with an increase in the gate resistance because of the resulting decrease in the cross-sectional area of the trench gate electrode and with realization of shrinkage along the thickness direction (vertical direction) of the semiconductor substrate.

SUMMARY OF THE INVENTION

It is an object of the invention to provide a power MISFET and a manufacturing method that make it possible to achieve miniaturization of the device structure without being affected by the constraints from the photolithography technology and that can suppress the side effects originating from miniaturization.

In the invention disclosed in the present application, the outline of a representative example is as follows.

A method of manufacturing a semiconductor device according to the invention includes the steps of: (a) forming a first insulating film over a main surface of a semiconductor substrate of a first conductivity type; (b) patterning the first insulating film to form an opening; and (c) forming a gate trench in the semiconductor substrate using as a mask the first insulating film in which the opening has been formed. The method also includes the steps of: (d) forming a gate insulating film over the gate trench; (e) forming a polysilicon film over the first insulating film including within the gate trench; and (f) removing the polysilicon film formed over the first insulating film and allowing the polysilicon film to remain in the opening of the first insulating film and in the gate trench, to form a gate electrode. The method also includes the steps of: (g) removing a portion of the first insulating film to allow a portion of the gate electrode to protrude from the semiconductor substrate; (h) implanting an impurity into the semiconductor substrate to form a source region of the first conductivity type in an adjacent region to the gate electrode; and (i) forming a second insulating film over the semiconductor substrate. The method also includes the steps of: (j) anisotropically etching the second insulating film to form a sidewall over a side wall portion of the gate electrode that protrudes from the semiconductor substrate; and (k) removing a portion of the semiconductor substrate that is between the sidewalls formed on adjacent gate electrodes, to form a body trench deeper than the depth of the source region. The method also includes the steps of: (l) implanting an impurity into the semiconductor substrate to form a first semiconductor region that serves as a body contact region of a second conductivity type at a bottom portion of the body trench; and (m) forming a first metal silicide film in the gate electrode, the source region, and the first semiconductor region. In the step (k) of the method, the body trench is self-aligned with the gate electrode.

In another aspect, a method of manufacturing a semiconductor device according to the invention includes the steps of: (a) forming a first insulating film over a main surface of a semiconductor substrate of a first conductivity type; (b) patterning the first insulating film to form an opening; and (c) forming a gate trench in the semiconductor substrate using as a mask the first insulating film in which the opening has been formed. The method also includes the steps of: (d) forming a gate insulating film over the gate trench; (e) forming a polysilicon film over the first insulating film including within the gate trench; and (f) removing the polysilicon film formed over the first insulating film and allowing the polysilicon film to remain in the opening of the first insulating film and in the gate trench, to form a gate electrode. The method also includes the steps of: (g) removing a portion of the first insulating film to allow a portion of the gate electrode to protrude from the semiconductor substrate; (h) implanting an impurity into the semiconductor substrate to form a first source region of the first conductivity type in an adjacent region to the gate electrode; and (i) forming a second insulating film over the semiconductor substrate. The method also includes the steps of: (j) anisotropically etching the second insulating film to form a sidewall over a side wall portion of the gate electrode that protrudes from the semiconductor substrate; and (k) implanting an impurity into the semiconductor substrate to form a second source region of the first conductivity type in an adjacent region to the first source region. The method also includes the steps of: (l) removing a portion of the semiconductor substrate that is between the sidewalls formed on adjacent gate electrodes, to thereby form a body trench that is deeper than the depth of the second source region; and (m) implanting an impurity into the semiconductor substrate to form a first semiconductor region that serves as a body contact region of a second conductivity type at a bottom portion of the body trench. In this method, the first source region is formed in a region shallower than the second source region, and in the step (l), the body trench is aligned with the gate electrode.

In another aspect, a semiconductor device according to the invention includes: (a) a semiconductor substrate of a first conductivity type; (b) a gate trench formed in a main surface of the semiconductor substrate; and (c) a gate insulating film formed over an inner wall and a bottom portion of the gate trench. The semiconductor device also includes: (d) a gate electrode formed so as to fill the gate trench and a portion of which protrudes from the semiconductor substrate; (e) a sidewall formed on a side wall portion of the gate electrode protruding from the semiconductor substrate; and (f) a source region of the first conductivity type, formed so as to be adjacent to the gate electrode. The semiconductor device also includes: (g) a body trench formed between the sidewalls formed on adjacent gate electrodes by self-alignment with the gate electrodes, so as to be deeper than a depth of the source region; and (h) a first semiconductor region formed at a bottom portion of the body trench and having a second conductivity type that is different from the first conductivity type. The semiconductor device also includes: (i) a drain region of the first conductivity type, formed in an opposite surface to the main surface of the semiconductor substrate; and (j) a first metal silicide film formed in the gate electrode, the source region, and the first semiconductor region, wherein the source region and the first semiconductor region are electrically coupled to each other by the first metal silicide film.

In another aspect, a semiconductor device according to the invention includes: (a) a semiconductor substrate of a first conductivity type; (b) a gate trench formed in a main surface of the semiconductor substrate; (c) a gate insulating film formed over an inner wall and a bottom portion of the gate trench; and (d) a gate electrode formed so as to fill the gate trench and a portion of which protrudes from the semiconductor substrate. The semiconductor device also includes: (e) a first source region of the first conductivity type, formed so as to be adjacent to the gate electrode; (f) a sidewall formed over a side wall portion of the gate electrode protruding from the semiconductor substrate; and (g) a second source region of the first conductivity type, formed so as to be adjacent to the first source region; The semiconductor device also includes: (h) a body trench formed between the sidewalls formed on adjacent gate electrodes by self-alignment with the gate electrodes, so as to be deeper than a depth of the second source region; and (i) a first semiconductor region formed at a bottom portion of the body trench and having a second conductivity type that is different from the first conductivity type. The semiconductor device also includes: (j) a drain region of the first conductivity type, formed in an opposite surface to the main surface of the semiconductor substrate, wherein the first source region is formed in a region shallower than the second source region.

An advantage obtained by representative embodiments of the invention disclosed in the present application is described briefly in the following.

By introducing a manufacturing process by self-alignment, it becomes possible to achieve miniaturization of the device structure without being affected by the constraints arising from the photolithography technology and to suppress the side effects originating from the miniaturization.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
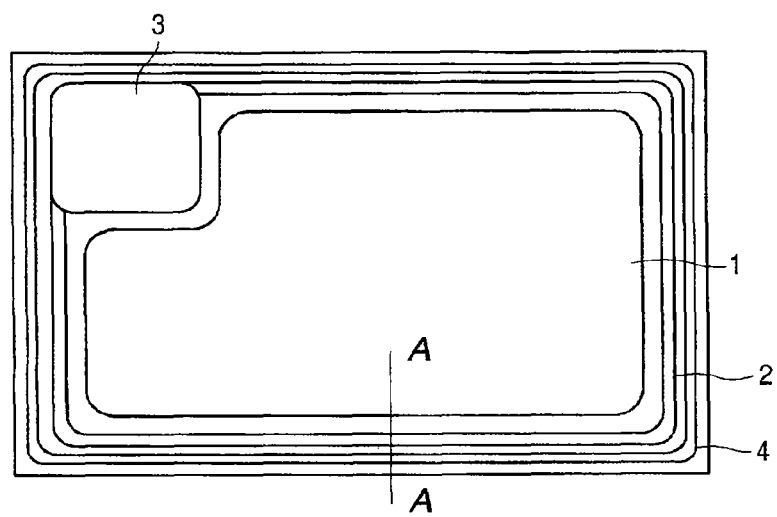
FIG. 1 is a plan view showing a semiconductor device according to a first preferred embodiment of the invention.

In the following description of the preferred embodiments, a plurality of sections or embodiments are separately described, but they are not irrelevant to one another except when clearly stated and each one may be a modification of, a detailed description of, or a complementary description of part or all of another.

Further, the number of an element and the like (including numbers of items, numerical values, quantities, and ranges) mentioned in the following description of the preferred embodiments are not limited to a particular number mentioned except when clearly stated and when clearly limited to particular numbers, and the number of that element may be either greater than the particular number or less than the particular number.

Moreover, needless to say, in the following description of the preferred embodiments, the elements (including the constituting process steps) are not necessarily indispensable unless clearly shown and unless clearly considered theoretically indispensable.

Likewise, the shapes, positional relationships, and the like of the constituting elements mentioned in the following description of the preferred embodiments are intended to include those substantially similar or analogous to the shapes and the like mentioned, except when clearly stated or when clearly considered theoretically that it is not the case. This also applies to the above-mentioned numerical values and ranges.

Furthermore, the same or like parts are designated by the same reference characters throughout the drawings for illustrating the preferred embodiments, and repetitive descriptions thereof are omitted. It should be noted that hatching may be used even in plan views for facility of comprehending the drawings.

(First Preferred Embodiment) A semiconductor device according to a first preferred embodiment is described with reference to the drawings. FIG. 1 is a plan view illustrating an upper surface of the semiconductor chip over which a semiconductor device according to the first preferred embodiment is formed. As shown in FIG. 1, a source pad 1 made of, for example, an aluminum wire is formed in a central portion of the semiconductor chip. A gate wire 2 is formed so as to surround the source pad 1, and the gate wire 2 is coupled to a gate pad 3. A guard ring 4 is formed outward of the gate pad 3 and the gate wire 2 so as to surround the circumference of the semiconductor chip. The gate wire 2, the gate pad 3, and the guard ring 4 are also formed of, for example, aluminum wire. The guard ring 4 is a ring-shaped structure provided around the element formation region for the purpose of surface protection.

Figure 2:
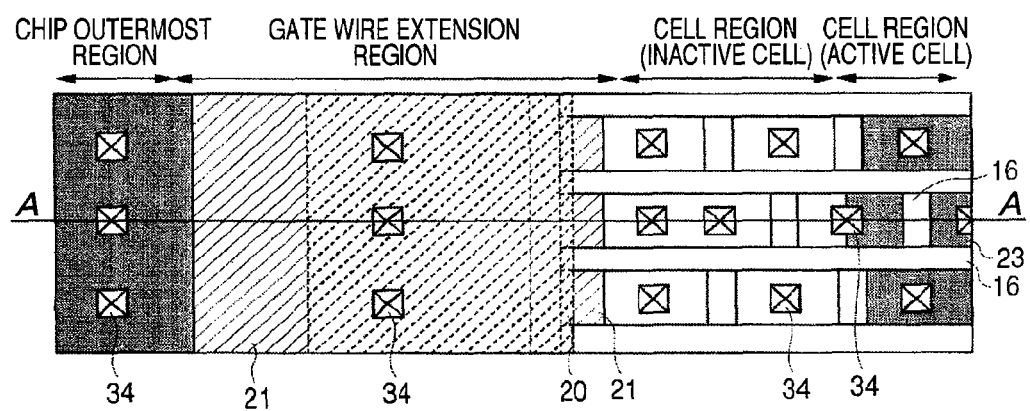
FIG. 2 is a plan view showing a portion of the planar structure of the semiconductor device according to the first preferred embodiment.

FIG. 2 is a schematic enlarged cross-sectional view taken along the line A-A in FIG. 1. FIG. 2 illustrates the structure formed in a layer that is below the surface layer shown in FIG. 1, in which the source pad 1, the gate wire 2, the gate pad 3, and the guard ring 4 are formed. In other words, it shows, in a plan view, the structure formed in a layer below the surface layer, with an interlayer dielectric film interposed therebetween. As shown in FIG. 2, a chip outermost region, a gate wire extension region, a cell region (inactive cell), and a cell region (active cell) are formed from the outer edge of the semiconductor chip along the line A-A in FIG. 1.

Referring to FIG. 2, a semiconductor region is formed in the chip outermost region, and plugs 34 are formed over the semiconductor region. These plugs 34 are coupled to the guard ring 4, shown in FIG. 1. Next, an insulating film 21 is formed in the gate wire extension region, and a gate extension electrode 20 is formed over this insulating film 21. The gate extension electrode 20 is coupled to the gate wire 2, shown in FIG. 1, via plugs 34. A portion of the gate extension electrode 20 is formed so as to pierce through the insulating film 21 and fill up the gate trenches that reach the semiconductor substrate, and the gate trenches extend to the cell regions. In the cell regions, the gate trenches are formed in a lattice-like pattern, and the gate trenches are filled with a polysilicon film, forming gate electrodes 16. In the cell region (inactive cell), no source region 23 is formed between the gate electrodes 16 formed in a lattice-like pattern. In the cell region (active cell), source regions 23, which are n-type semiconductor regions, are formed between the gate electrodes 16 formed in a lattice-like pattern. A plug 34 is formed over each source region 23 formed in the cell region (active cell), and the plug 34 is coupled to the source pad 1, shown in FIG. 1.

Figure 3:
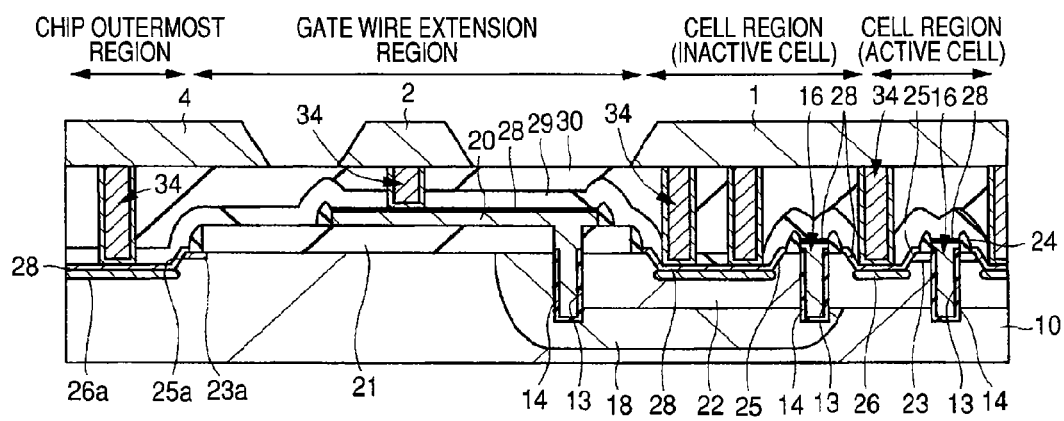
FIG. 3 is a cross-sectional view taken along the line A-A in FIG. 1.

FIG. 3 is a cross-sectional view taken along the line A-A in FIG. 1. In the chip outermost region shown in FIG. 3, an n-type semiconductor region 23a is formed over a surface of the n-type semiconductor substrate 10 (including an n-type epitaxial layer), and a trench 25a is formed adjacent to the n-type semiconductor region 23a. A p-type semiconductor region 26a is formed at a bottom portion of the trench 25a, and a cobalt silicide film 28 is formed in a surface of the semiconductor substrate 10 including a side surface of and a bottom portion of the trench 25a. Further, a silicon nitride film 29 is formed over the semiconductor substrate 10 in which the trench 25a is formed, and a silicon oxide film 30 is formed over the silicon nitride film 29. Plugs 34, which pierce through the silicon nitride film 29 and the silicon oxide film 30 and reach the p-type semiconductor region 26a formed at the bottom portion of the trench 25a, are formed in the silicon nitride film 29 and the silicon oxide film 30. The guard ring 4 is formed over these plugs 34.

Next, the configuration of the gate wire extension region is described. The insulating film 21 made of, for example, a silicon oxide film is formed in the gate wire extension region over the semiconductor substrate 10. On the other hand, a p-type well 18 made of a p-type semiconductor region is formed in the semiconductor substrate 10 from a portion of the gate wire extension region to the cell region (inactive cell). A gate trench 13 that pierces through the insulating film 21 and reaches the p-type well 18 is formed in the gate wire extension region, and a gate insulating film 14 made of, for example, a silicon oxide film is formed over the inner wall of the gate trench 13. In addition, the gate extension electrode 20 is formed so as to fill up the gate trench 13 and extend over the insulating film 21. This gate extension electrode 20 includes the cobalt silicide film 28. The silicon nitride film 29 is formed over the gate extension electrode 20, and the silicon oxide film 30 is formed over the silicon nitride film 29. Plugs 34 that pierce through the silicon nitride film 29 and the silicon oxide film 30 and reach the gate extension electrode 20 are formed in the silicon nitride film 29 and the silicon oxide film 30. The gate wire 2 is formed over these plugs 34.

Subsequently, the configuration of the cell region (inactive cell) is described. The p-type well 18 is formed in the semiconductor substrate 10 of the cell region (inactive cell), and a channel forming region 22, which becomes a body region, is formed in this p-type well 18. The channel forming region 22 comprises a p-type semiconductor region. A gate trench 13 is formed so as to pierce through the channel forming region 22, and a gate insulating film 14 made of, for example, a silicon oxide film is formed over the inner wall of the gate trench 13. A polysilicon film, for example, is filled over the gate insulating film 14 within the gate trench 13, forming a gate electrode 16. Most part of this gate electrode 16 is buried in the gate trench 13, but a portion thereof protrudes from a top portion of the gate trench 13. In other words, the gate electrode 16 has a portion within the gate trench 13 and a portion protruding from the interior of the gate trench 13 over a top portion of the semiconductor substrate 10. The gate electrode 16 is formed of a polysilicon film, and the cobalt silicide film 28 is formed over the top of the gate electrode 16. A sidewall 24 made of, for example, a silicon oxide film is formed in a side wall portion of this gate electrode 16 that protrudes from the semiconductor substrate 10. A body trench 25 is formed in the semiconductor substrate 10 adjacent to the sidewall 24. A body contact region comprising a p-type semiconductor region is formed at a bottom portion of the body trench 25. A cobalt silicide film 28 is formed over the surface of the body trench 25. The silicon nitride film 29 is formed over the semiconductor substrate 10 where the gate electrode 16 and the body trench 25 are formed in this way, and the silicon oxide film 30 is formed over the silicon nitride film 29. Plugs 34, which pierce through the silicon nitride film 29 and the silicon oxide film 30 and reach the body contact region formed at the bottom portion of the body trench 25, are formed in the silicon nitride film 29 and the silicon oxide film 30. These plugs 34 are electrically coupled to the source pad 1.

Next, the configuration of the cell region (active cell) is described. A channel forming region 22, which becomes a body region, is formed in the semiconductor substrate 10 within the cell region (active cell). The channel forming region 22 comprises a p-type semiconductor region. A gate trench 13 is formed so as to pierce through the channel forming region 22, and a gate insulating film made of, for example, a silicon oxide film is formed over the inner wall of the gate trench 13. A polysilicon film, for example, is filled over the gate insulating film 14 within the gate trench 13, forming a gate electrode 16. Most part of this gate electrode 16 is buried in the gate trench 13, but a portion thereof protrudes from a top portion of the gate trench 13. The gate electrode 16 is formed of a polysilicon film, and the cobalt silicide film is formed over the top of the gate electrode 16. A sidewall 24 made of, for example, a silicon oxide film is formed in a side wall portion of this gate electrode 16 that protrudes from the semiconductor substrate 10. A source region 23 comprising an n-type semiconductor region is formed in the semiconductor substrate 10 under the sidewall 24.

Herein, in order to achieve miniaturization of the device structure and improve the performance, it is necessary that the source region should be as shallow a junction as possible. However, with what is called a recess structure, in which the gate electrode can be formed only in the region below the semiconductor substrate surface, it is difficult to dispose the gate electrode stably relative to the source region because of variations in etch amount. If the device results in a source offset structure, in which the gate electrode is positioned below the source region, the device may no longer function as a FET. Essentially, a source region and a drain region are electrically coupled to each other with a channel formed by applying a positive voltage to a gate electrode. However, when the device results in a source offset structure, the source region and the drain region do not electrically couple with each other easily, resulting in a considerable increase in the on-state resistance of the power MISFET. In contrast, the power MISFET according to the first preferred embodiment makes it possible to dispose the gate electrode 16 stably with respect to the source region 23 by allowing a portion of the gate electrode 16 to protrude from the semiconductor substrate 10, thereby reliably preventing a source offset structure.

A body trench 25 is formed in the semiconductor substrate 10 adjacent to the sidewall 24. A body contact region that comprises a p-type semiconductor region is formed at a bottom portion of the body trench 25. A cobalt silicide film 28 is formed over the surface of the body trench 25. In other words, the cobalt silicide film 28 is formed over the source region 23 that is exposed from a side surface of the body trench 25, and over a body contact region 26 formed at a bottom portion of the body trench 25. In other words, the source region 23 and the body contact region 26 are electrically coupled to each other by the cobalt silicide film 28. The silicon nitride film 29 is formed over the semiconductor substrate 10 where the gate electrode 16 and the body trench 25 are formed in this way, and the silicon oxide film 30 is formed over the silicon nitride film 29. Plugs 34, which pierce through the silicon nitride film 29 and the silicon oxide film 30 and reach the body contact region formed at the bottom portion of the body trench 25, are formed in the silicon nitride film 29 and the silicon oxide film 30. These plugs 34 are electrically coupled to the source pad 1.

The power MISFET according to the first preferred embodiment is configured as described above. What actually operates as a power MISFET is the power MISFET formed in the cell region (active cell). The operation of this power MISFET will be discussed. In this power MISFET, a positive voltage is applied to the drain region formed in the n-type semiconductor substrate 10 to ground the source region 23. Then, a positive voltage is applied to the gate electrode 16, from the state in which the gate electrode 16 is grounded and is not working. When a positive voltage is applied to the gate electrode 16, the electrons present in the channel forming region 22 gather toward the side surface of the gate trench 13, which forms the gate electrode 16, and the channel forming region 22 that is adjacent to the side surface of the gate trench 13 turns to an n-type semiconductor region. This inverted n-type semiconductor region becomes a channel, which is a path for electrons. The source region and the semiconductor substrate 10 (drain region) are coupled to each other by this channel, causing the electrons to flow from the source region via the channel to the drain region. In other words, since electric current flows in the opposite direction to the electron flow, the current flows from the drain region via the channel to the source region. In this way, current flows along the thickness of the semiconductor substrate 10 (in the vertical direction), turning on the power MISFET. Subsequently, when the gate electrode 16 is turned from a state in which a positive voltage is applied into a grounded state or a state to which a negative voltage is applied, the channel near the side surface of the gate trench 13 disappears. Therefore, the source region and the drain region are electrically disconnected, and the power MISFET is turned off. Repeating this series of operations allows the power MISFET to be turned on/off. Thus, by controlling a voltage applied to the gate electrode 16, the power MISFET can be used as a switch.

Here, a difference in the configuration of the power MISFET from a normal MISFET is that, in the power MISFET, an n-type semiconductor region, which becomes a source region, and a p-type semiconductor region, which becomes a body contact region, are disposed adjacent to each other, and are electrically coupled to each other by the same contact (plug). This is for keeping the source region and the body contact region to be at the same potential, which is a common structure for the power MISFET. The reason why a body contact region is formed in the power MISFET will be discussed with reference to the drawings.

Figure 4:
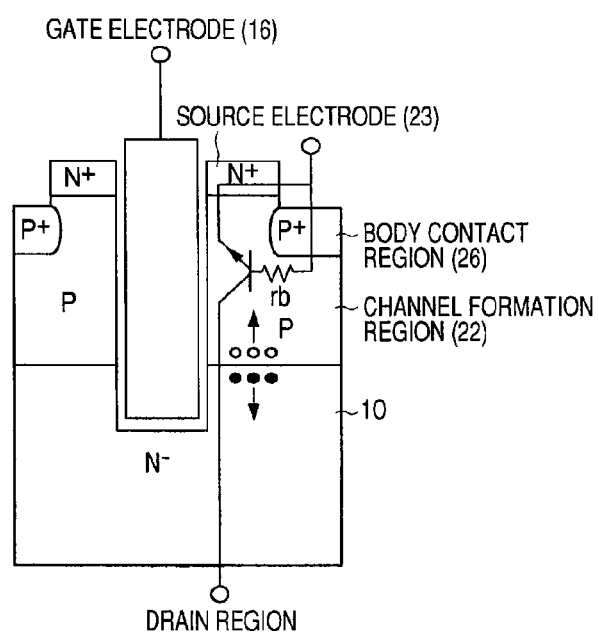
FIG. 4 is a schematic view illustrating an n-channel power MISFET having a gate trench structure.

FIG. 4 is a schematic view illustrating an n-channel power MISFET having a gate trench structure. Referring to FIG. 4, an n-type semiconductor substrate 10 (including an n-type epitaxial layer) is formed as a drain region. A channel forming region 22 (p-type semiconductor region), which becomes a body region, is formed over the semiconductor substrate 10. A source region 23 (n-type semiconductor region) is formed above the channel forming region 22 (over the surface). A gate electrode 16 of the gate trench structure and a body contact region 26 (p-type semiconductor region) are formed adjacent to the source region 23. In the power MISFET thus formed, when the power MISFET is turned off, the gate voltage applied to the gate electrode 16 becomes equal to or lower than the threshold voltage. Then, the channel formed near the side surface of the gate electrode 16 disappears, cutting off the current path, so the drain current does not flow. At this time, a counterelectromotive force is generated in the load with inductance (L), and the generated counterelectromotive force is applied to the drain region of the power MISFET.

Therefore, a reversed bias voltage is applied to the pn junction formed at the boundary between the n-type the semiconductor substrate 10 and the channel forming region 22 (p-type semiconductor region). When this reversed bias voltage exceeds the junction withstand voltage of the pn junction, avalanche breakdown occurs, and a large amount of electron-hole pairs are generated.

In a power MISFET, a parasitic npn bipolar transistor is formed by the source region 23 (n-type semiconductor region), the channel forming region 22 (p-type semiconductor region), and the semiconductor substrate 10 (n-type semiconductor region). Electrons produced when avalanche breakdown occurs flow into the drain region, and holes travel through the channel forming region 22 and directly below the source region 23, and flow into the body contact region 26. Here, the channel forming region 22 corresponds to the base region of the parasitic npn bipolar transistor, and when the base resistance is large, the parasitic bipolar transistor is turned on. In such a cell in which a parasitic npn bipolar transistor is turned on, an uncontrollable large current flows through the gate electrode 16 of the power MISFET, generating heat. At this time, because of the temperature rise due to the heat generation, the electrical resistance of the semiconductor region reduces, allowing a further large current to flow therethrough, so positive feedback occurs. As a result, a large current flows through locally, causing the power MISFET to break. This phenomenon is called avalanche breakdown.

In order for such avalanche breakdown not to occur, it is necessary to lower the base resistance so that the parasitic npn bipolar transistor is not turned on. For this reason, the channel forming region 22, which becomes the base region, is provided with the body contact region 26. In this body contact region 26, a p-type impurity is implanted at a higher concentration than in the channel forming region 22, to reduce the base resistance. Moreover, the body contact region 26 is disposed adjacent to the source region 23, to reduce the base resistance. Furthermore, by electrically coupling the body contact region 26 to the source region 23, the potential difference between the base region (the body contact region 26) and the emitter region (the source region 23) is made as small as possible so that the parasitic npn bipolar transistor cannot be turned on. In other words, the power MISFET is provided with such a configuration in which the body trench is formed, the body contact region 26 is formed at a bottom portion of the body trench, and the body contact region 26 and the source region 23 are coupled to each other, in order to avoid the turning on of the parasitic npn bipolar transistor as much as possible and prevent the avalanche breakdown of the power MISFET.

In order to advance miniaturization in the power MISFET configured in this way, it is necessary to shrink the constituting components that form the power MISFET. For example, the body trench is generally formed using a photolithography technique and an etching technique. In this case, it is impossible to avoid the problem of misalignment associated with the photolithography technique, and it is necessary to provide a certain alignment tolerance between the gate electrode 16 and the body trench. This is a serious limitation for the advancement in miniaturization.

Here, one feature in the first preferred embodiment is that the body trench is formed using a self-alignment technique, not using the photolithography technique. This technique achieves miniaturization of the body trench without being regulated by the photolithography technique. Specifically, the body trench is formed by self-alignment in the following manner. As illustrated in FIG. 3, a sidewall 24 is formed in a side wall portion of a gate electrode 16, which protrudes from the surface of the semiconductor substrate 10; this sidewall 24 is utilized. Specifically, by etching the semiconductor substrate 10 using the sidewalls 24 formed on the side wall portions of adjacent gate electrodes 16 as a mask, a body trench 25 can be formed in an adjacent region to the gate electrodes 16. This method enables the body trench 25 to be formed by self-alignment with the gate electrodes 16, so the problem of misalignment does not arise, unlike the case of the photolithography technique. Therefore, it becomes possible to narrow the space between the gate electrode 16 and the body trench 25, and to advance miniaturization beyond the limit of the photolithography technique.

In the power MISFET according to the first preferred embodiment, there exists evidence showing that the body trench 25 has been formed by being aligned with gate electrodes 16, not by a photolithography technique. This evidence becomes obvious as the structure in which the height of the uppermost portion of the sidewall 24 is higher than the height of the uppermost portion of the gate electrode 16, as seem from FIG. 3. That is, the body trench 25 is formed by etching the silicon that forms the semiconductor substrate 10. When forming the body trench 25 by etching, the etching is conducted under the condition in which the gate electrodes 16 formed of the polysilicon film are exposed. Therefore, a portion of each of the gate electrodes 16 is also etched. On the other hand, the sidewall 24 is formed of a silicon oxide film and therefore it is not etched when etching silicon. Thus, the structure in which the height of the uppermost portion of the sidewall 24 is higher than the height of the uppermost portion of the gate electrode 16 is formed. Therefore, it follows that the structure in which the height of the uppermost portion of the sidewall 24 is higher than the height of the uppermost portion of the gate electrode 16 indicates that the body trench 25 has been formed by self-alignment with the gate electrodes 16.

In order to achieve miniaturization of the power MISFET in a horizontal direction, it is necessary to achieve miniaturization of the gate electrode 16 as well as the miniaturization of the body trench 25. However, when attempting miniaturization of the gate electrode 16, the problem of gate resistance increase in the gate electrode 16 arises because the width of the gate electrode 16 becomes smaller. In other words, when attempting miniaturization of the power MISFET in a horizontal direction, another side effect arises.

In the first preferred embodiment, however, the gate electrode 16 is formed from the polysilicon film and the cobalt silicide film 28 formed over the polysilicon film. Since the cobalt silicide film 28 has a low resistance, it is possible to suppress an increase in the gate resistance due to the attempt of miniaturization of the gate electrode 16. Thus, the first preferred embodiment makes it possible to suppress the side effect associated with the miniaturization of the power MISFET in a horizontal direction. In other words, the first preferred embodiment achieves miniaturization of the power MISFET while suppressing the side effect of gate resistance increase.

Moreover, the cobalt silicide film 28 is also formed over the surface of the body trench 25. This makes it possible to electrically couple the body contact region 26 formed at a bottom portion of the body trench 25 and the source region 23 exposed from the side surface of the body trench 25 with the cobalt silicide film 28. This point is also one feature of the invention. The body contact region 26 is a p-type semiconductor region while the source region 23 is a n-type semiconductor region. Accordingly, to electrically couple the body contact region 26 and the source region 23 with each other, it is necessary to bring the body contact region 26 and the source region 23 into contact with the plug 34. This means that the width of the plug 34 needs to be wide, increasing the risk of bringing the plug 34 into contact with the gate electrode 16. Nevertheless, in the first preferred embodiment, the body contact region 26 and the source region 23 are electrically coupled with each other by the cobalt silicide film 28, and therefore, the plug 34 need not be in contact with both the body contact region 26 and the source region 23. Therefore, no problem arises even if miniaturization of the plug 34 is attempted and the width is narrowed. Specifically, even if the plug 34 is structured so as to be coupled only to the body contact region 26, for example, no problem arises since the source region 23 can be electrically coupled to the body contact region 26 and the plug 34 via the cobalt silicide film 28. For this reason, the plug 34 can be miniaturized and the contact margin of the plug 34 and the gate electrode 16 can be made large. As a result, reliability of the power MISFET can be improved. Furthermore, even if the plug 34 is not coupled to both the body contact region 26 and the source region 23 because of misalignment of the plug 34, the body contact region 26 and the source region 23 can be electrically coupled to each other by the cobalt silicide film 28. Therefore, a large tolerance margin for the misalignment of the plug 34 can be ensured. In addition, since the cobalt silicide film 28 is formed so as to be in contact with the source region 23 and the body contact region 26, there is an advantage of suppressing electrical resistance even when the source region 23 and the body contact region 26 are miniaturized.

Also, another feature of the first preferred embodiment is that the contact margin of the plug 34 and the gate electrode 16 can be made large by forming the plug 34 by SAC (self-alignment contact). These features become apparent in the manufacturing processes. Therefore, the features will be discussed in detail when describing the manufacturing method of the power MISFET.

Next, a manufacturing method of a power MISFET according to the first preferred embodiment is described with reference to the drawings.

Figure 5:
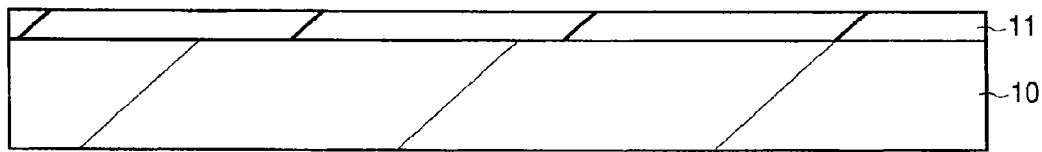
FIG. 5 is a cross-sectional view illustrating a manufacturing process of the semiconductor device according to the first preferred embodiment.

As shown in FIG. 5, using an epitaxial growth technique, an n-type epitaxial layer is formed over the semiconductor substrate 10 doped with an n-type impurity. In the first preferred embodiment, the semiconductor substrate 10 doped with an n-type impurity and the n-type epitaxial layer are collectively referred to as a semiconductor substrate 10. The insulating film 11 (the first insulating film) is formed over the semiconductor substrate 10 using, for example, a thermal oxidation technique. This insulating film 11 is formed of, for example, a silicon oxide film.

Figure 6:
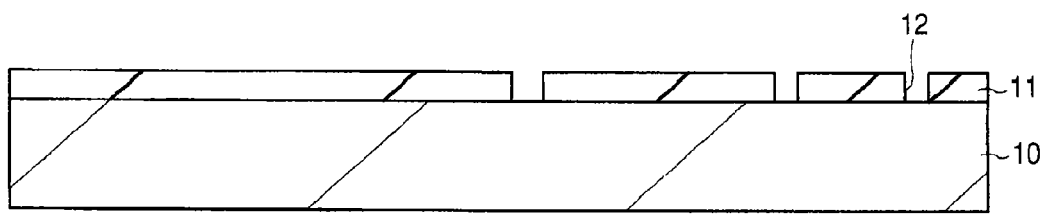
FIG. 6 is a cross-sectional view illustrating a manufacturing process of the semiconductor device subsequent to the manufacturing process shown in FIG. 5.
Figure 7:
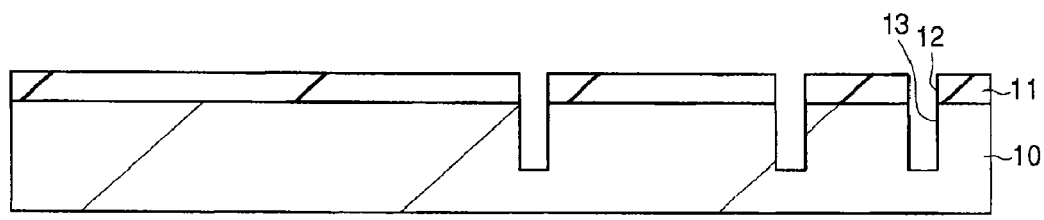
FIG. 7 is a cross-sectional view illustrating a manufacturing process of the semiconductor device subsequent to the manufacturing process shown in FIG. 6.

Subsequently, as shown in FIG. 6, the insulating film 11 is patterned to form openings 12, using a photolithography technique and an etching technique. Then, as shown in FIG. 7, the gate trenches 13 are formed in the semiconductor substrate 10, using as a mask the insulating film 11 in which the openings 12 have been formed. The gate trenches 13 are formed by, for example, dry etching.

Figure 8:
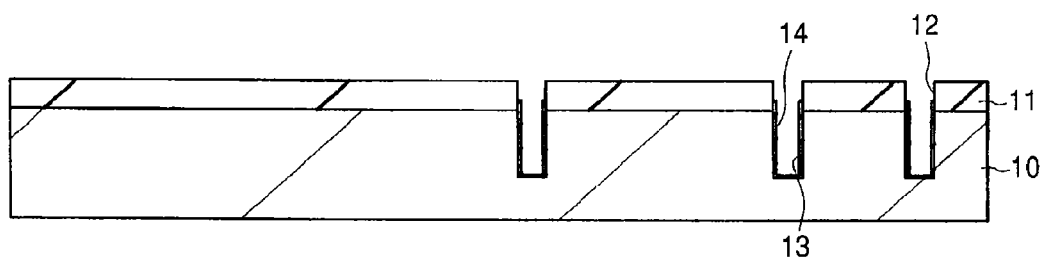
FIG. 8 is a cross-sectional view illustrating a manufacturing process of the semiconductor device subsequent to the manufacturing process shown in FIG. 7.

Next, as shown in FIG. 8, the gate insulating film 14 is formed over the inner wall of each of the gate trenches 13. This gate insulating film 14 is formed of, for example, a silicon oxide film, and can be formed by, for example, a thermal oxidation technique. It should be noted, however, that the gate insulating film 14 is not restricted to the silicon oxide film but may be formed of various other materials. For example, the gate insulating film 14 may be a silicon oxynitride (SiON) film. In other words, it is possible to adopt a structure in which nitrogen is segregated at the interface between the gate insulating film 14 and the semiconductor substrate 10. The silicon oxynitride film is more effective than the silicon oxide film to suppress the interface state in the film and to reduce electron trapping. Therefore, the use of the silicon oxynitride film can improve the hot carrier resistance of the gate insulating film 14, improving the dielectric strength. Moreover, impurities are less likely to pierce through the silicon oxynitride film than the silicon oxide film. For this reason, the use of the silicon oxynitride film as the gate insulating film 14 can suppress variations in threshold voltage because of the diffusion of the impurity in the gate electrode to the semiconductor substrate 10 side. To form the silicon oxynitride film, it is recommended to anneal the semiconductor substrate 10 in an atmosphere containing nitrogen, such as NO, $NO_2$, or $NH_3$. Alternatively, the same effect can be obtained by forming the gate insulating film 14 formed of a silicon oxide film over the surface of the semiconductor substrate 10, and thereafter annealing the semiconductor substrate 10 in an atmosphere containing nitrogen to segregate nitrogen at the interface between the gate insulating film 14 and the semiconductor substrate 10.

The gate insulating film 14 may be formed of, for example, a high dielectric constant film that has a higher dielectric constant than the silicon oxide film. Conventionally, the silicon oxide film has been used as the gate insulating film 14 from the viewpoints of high dielectric strength and good electrical and physical stability in the silicon-silicon oxide interface. Nevertheless, as device miniaturization advances, the gate insulating film 14 has been increasingly required to have an extremely small film thickness. The use of such a thin silicon oxide film as the gate insulating film 14 causes what is called a tunnel current, the phenomenon in which the electrons passing through the channel of the MISFET tunnels through the barrier formed by the silicon oxide film and flows into the gate electrode.

In view of this, the use of a high dielectric film has become popular; the high dielectric film can increase the physical thickness with the same capacity by using a material with a higher dielectric constant than that of the silicon oxide film. Since the high dielectric film can increase the physical film thickness with the same capacity, so it becomes possible to reduce leakage current.

For example, a hafnium dioxide film ($HfO_2$ film), one of hafnium oxides, is used as the high dielectric film. In place of the hafnium dioxide film, it is also possible to use other hafnium-based insulating films, such as a hafnium aluminate film, a HfON film (hafnium oxynitride film), a HfSiO film (hafnium silicate film), a HfSiON film (hafnium silicon oxynitride film), and a HfAlO film. Further, it is also possible to use hafnium-based insulating films in which an oxide such as tantalum oxide, niobium oxide, titanium oxide, zirconium oxide, lanthanum oxide, or yttrium oxide is implanted into one of these hafnium-based insulating films. Since the hafnium-based insulating films have a higher dielectric constant than the silicon oxide film and the silicon oxynitride film as with the hafnium dioxide film, the use of the hafnium-based insulating films can obtain the same effect as in the case of using the hafnium dioxide film.

Figure 9:
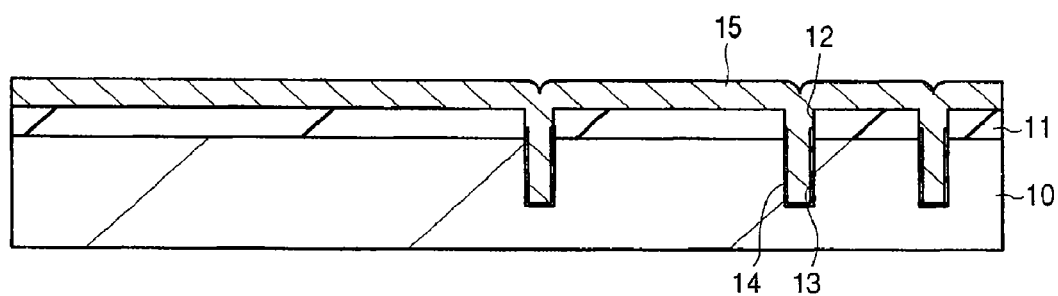
FIG. 9 is a cross-sectional view illustrating a manufacturing process of the semiconductor device subsequent to the manufacturing process shown in FIG. 8.
Figure 10:
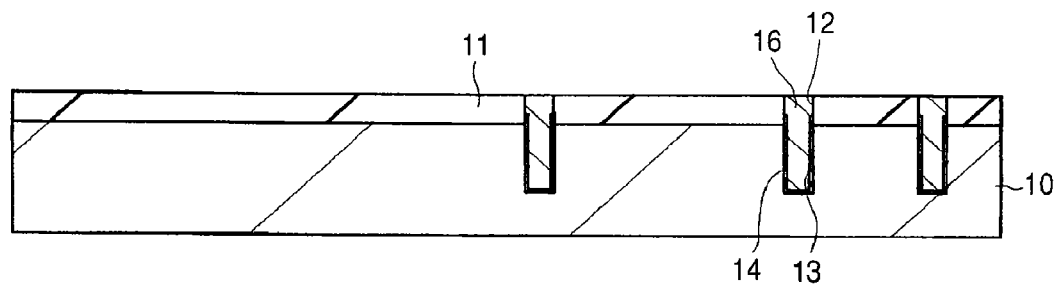
FIG. 10 is a cross-sectional view illustrating a manufacturing process of the semiconductor device subsequent to the manufacturing process shown in FIG. 9.

Next, as shown in FIG. 9, the polysilicon film 15 is formed over the insulating film 11. At this time, the polysilicon film 15 is formed so as to fill the interior of the gate trenches 13. An n-type impurity such as phosphorus (P) or arsenic (As) is added to the polysilicon film 15, and the polysilicon film 15 may be formed using, for example, a CVD (Chemical Vapor Deposition) technique. Subsequently, as shown in FIG. 10, the polysilicon film 15 formed over the insulating film 11 is removed by an entire surface etchback using dry etching or by polishing using a chemical mechanical polishing (CMP) technique. Thereby, the polysilicon film 15 remains only in the interior of the openings 12 and the gate trenches 13 provided in the insulating film 11. Thus, the gate electrodes 16 are formed.

Figure 11:
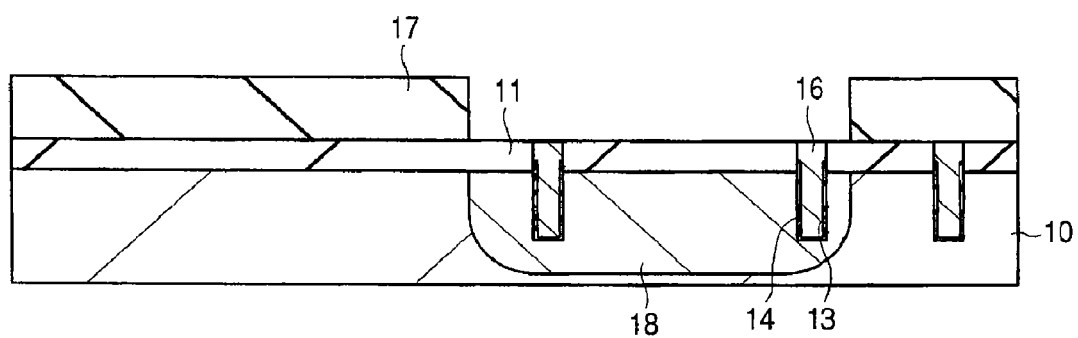
FIG. 11 is a cross-sectional view illustrating a manufacturing process of the semiconductor device subsequent to the manufacturing process shown in FIG. 10.

Thereafter, as shown in FIG. 11, a resist film 17 is applied, and then, exposure and development processes are performed to pattern the resist film 17. The patterning is conducted so as to form an opening in the region where the p-type well 18 is to be formed. Specifically, the resist film is patterned so as to open a portion of the gate wire extension region and the cell region (inactive cell). Then, a p-type impurity such as boron (B) is ion-implanted using the patterned resist film 17 as a mask, whereby the p-type well 18 is formed.

Figure 12:
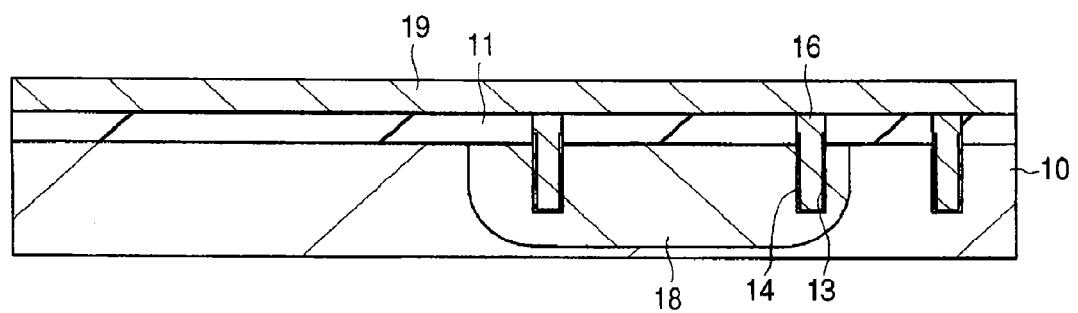
FIG. 12 is a cross-sectional view illustrating a manufacturing process of the semiconductor device subsequent to the manufacturing process shown in FIG. 11.
Figure 13:
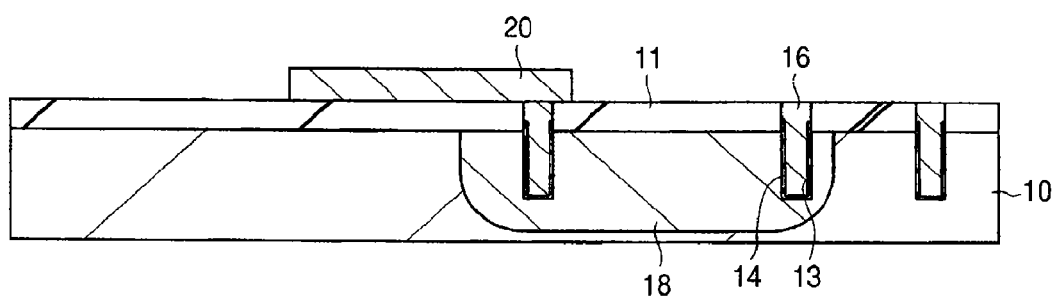
FIG. 13 is a cross-sectional view illustrating a manufacturing process of the semiconductor device subsequent to the manufacturing process shown in FIG. 12.
Figure 14:
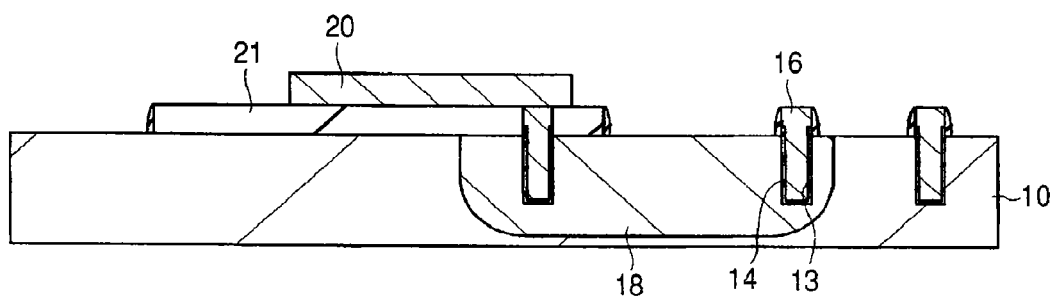
FIG. 14 is a cross-sectional view illustrating a manufacturing process of the semiconductor device subsequent to the manufacturing process shown in FIG. 13.

Next, as shown in FIG. 12, the polysilicon film 19 is formed over the insulating film 11 including the gate electrodes 16. An n-type impurity such as phosphorus or arsenic is added to the polysilicon film 19, and the polysilicon film 19 may be formed using, for example, a CVD technique. Then, as shown in FIG. 13, the polysilicon film 19 is patterned using a photolithography technique and an etching technique. Thereby, the gate extension electrode 20 can be formed in the gate wire extension region. Further, as shown in FIG. 14, the insulating film 11 is patterned using a photolithography technique and an etching technique. The insulating film 11 that is formed in the cell region (inactive cell) and in the cell region (active cell) is removed through this patterning. As a result, each of the gate electrodes 16 takes such a shape that a portion thereof protrudes from the semiconductor substrate 10. In other words, a gate electrode 16 a portion of which protrudes from the semiconductor substrate 10 can be formed through the step of removing the insulating film 11. On the other hand, the insulating film 11 is patterned to remain in the gate wire extension region, and as a result, the insulating film 21 remains below the gate extension electrode 20.

Figure 15:
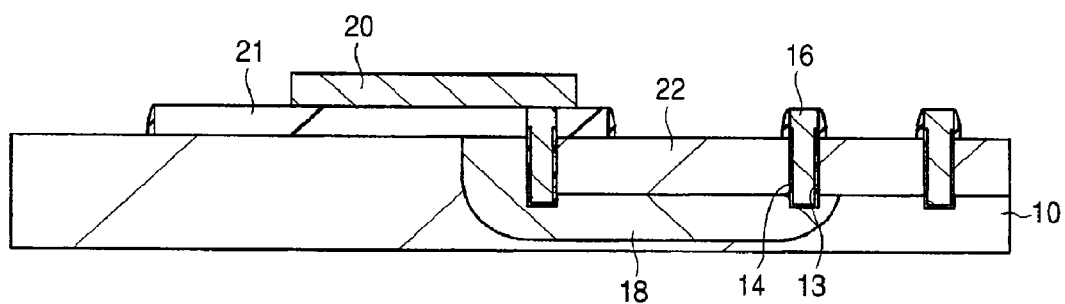
FIG. 15 is a cross-sectional view illustrating a manufacturing process of the semiconductor device subsequent to the manufacturing process shown in FIG. 14.
Figure 16:
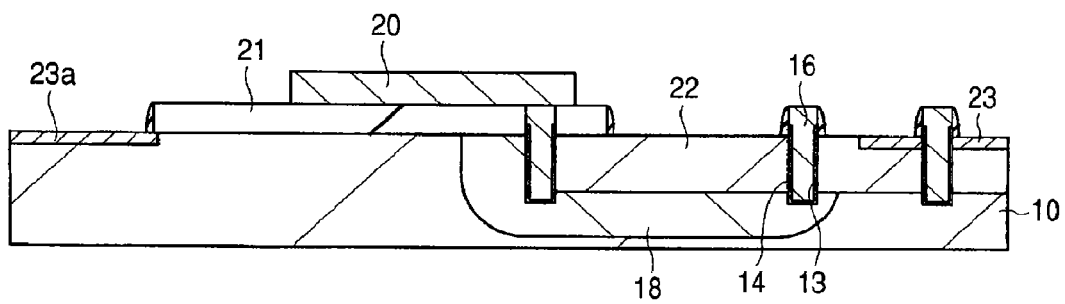
FIG. 16 is a cross-sectional view illustrating a manufacturing process of the semiconductor device subsequent to the manufacturing process shown in FIG. 15.

Subsequently, as shown in FIG. 15, the channel forming region 22, which becomes the body region, is formed in the semiconductor substrate 10 within the cell region (inactive cell) and the cell region (active cell) using a photolithography technique and an etching technique. This channel forming region 22 is a p-type semiconductor region doped with a p-type impurity such as boron. Next, as shown in FIG. 16, the source region 23 is formed in the cell region (active cell) using a photolithography technique and an ion implantation technique. The source region 23 is formed in a region adjacent to the gate electrode 16. The source region 23 is an n-type semiconductor region doped with an n-type impurity such as arsenic. It should be noted that, in the step of forming the source region 23, an n-type semiconductor region 23a is also formed in the chip outermost region.

Figure 17:
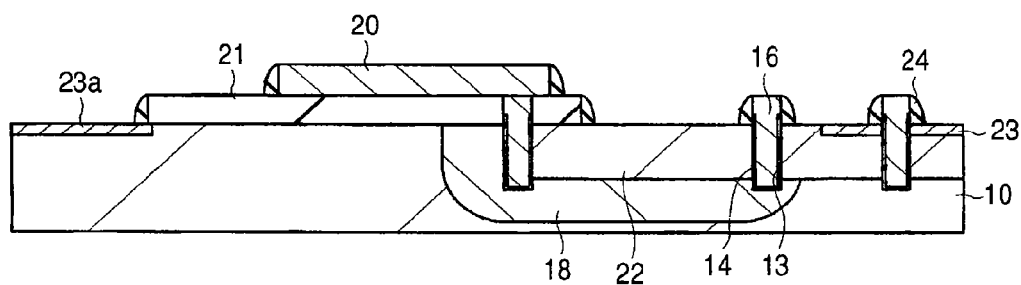
FIG. 17 is a cross-sectional view illustrating a manufacturing process of the semiconductor device subsequent to the manufacturing process shown in FIG. 16.

Then, as shown in FIG. 17, a silicon oxide film (second insulating film) is formed over the semiconductor substrate 10 using, for example, a CVD technique and thereafter, by subjecting the formed silicon oxide film to anisotropic dry etching, sidewalls 24 are formed on side wall portions of the gate electrodes 16. Since portions of the gate electrodes 16 protrude from the semiconductor substrate 10, the sidewalls 24 are formed on the side wall portions of the protruding portions.

Figure 18:
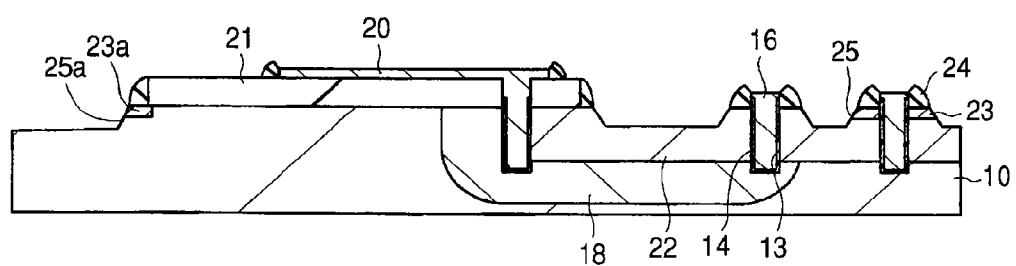
FIG. 18 is a cross-sectional view illustrating a manufacturing process of the semiconductor device subsequent to the manufacturing process shown in FIG. 17.

Next, as shown in FIG. 18, using the sidewalls 24 as a mask, a body trench 25 that is deeper than the depth of the adjacent source region 23 is formed. Specifically, the body trench 25 self-aligned with the adjacent gate electrodes 16 is formed between the sidewalls 24 formed over the side wall portions of the adjacent gate electrodes 16. This point is one of the features of the invention. By forming the body trench 25 self-aligned with the gate electrodes 16, the body trench 25 can be formed without using a photolithography technique. Conventionally, the body trench 25 has been formed by a photolithography technique using a resist film as a mask. In this case, it has been difficult to achieve miniaturization because of the problem of alignment accuracy originating from the photolithography technique. In view of this, in the first preferred embodiment, the body trench 25 is formed using the sidewalls 24 as a mask, without using the photolithography technique. It should be noted that the body trench 25 is formed by etching the semiconductor substrate 10 formed of silicon. The sidewalls 24 can be utilized as a mask in etching silicon because the sidewalls 24 are formed of a silicon oxide film. In this way, according to the first preferred embodiment, it becomes possible to eliminate the limitation arising from the problem of alignment accuracy and reduce the occupied area by a unit cell, because the body trench 25 is formed without using a photolithography technique.

In the power MISFET according to the first preferred embodiment, there exists evidence showing that the body trench 25 has been formed by being aligned with gate electrodes 16, not by a photolithography technique. This evidence becomes obvious as the structure in which the height of the uppermost portion of the sidewall 24 is higher than the height of the uppermost portion of the gate electrode 16, as seem from FIG. 18. That is, the body trench 25 is formed by etching the silicon that forms the semiconductor substrate 10. When forming the body trench 25 by etching, the etching is conducted under the condition in which the gate electrodes 16 formed of the polysilicon film are also exposed. Therefore, a portion of each of the gate electrodes 16 is also etched. On the other hand, the sidewall 24 is formed of a silicon oxide film and therefore it is not etched when etching silicon. Thus, the structure in which the height of the uppermost portion of the sidewall 24 is higher than the height of the uppermost portion of the gate electrode 16 is formed. Therefore, it follows that the structure in which the height of the uppermost portion of the sidewall 24 is higher than the height of the uppermost portion of the gate electrode 16 indicates that the body trench 25 has been formed by self-alignment with the gate electrodes 16.

It should be noted that, in the step of forming the body trench 25 in each of the cell region (inactive cell) and the cell region (active cell), a trench 25a is also formed in the chip outermost region.

Figure 19:
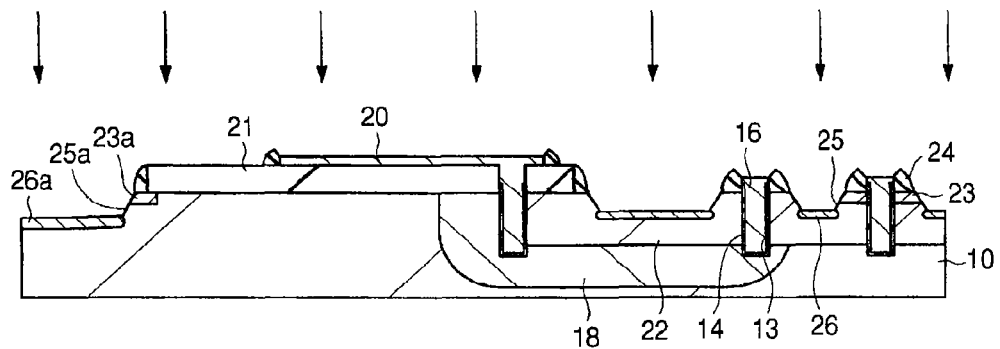
FIG. 19 is a cross-sectional view illustrating a manufacturing process of the semiconductor device subsequent to the manufacturing process shown in FIG. 18.

Subsequently, as shown in FIG. 19, the body contact region (the first semiconductor region) 26 is formed at the bottom portion of the body trench 25 by implanting a p-type impurity such as boron fluoride over the entire surface of the main surface (element forming surface) of the semiconductor substrate 10. It should be noted that a p-type semiconductor region 26a is also formed in the chip outermost region. The body contact region 26 is a p-type semiconductor region doped with the p-type impurity at a higher concentration than in the channel forming region 22. This body contact region 26 is formed by implanting the p-type impurity over the entire surface of the semiconductor substrate 10 without using a photolithography technique. At this time, since the sidewalls 24 present on the side wall portion of each gate electrode 16 serves as a mask for ion implantation, it is possible to form the body contact region 26 to be self-aligned with the gate electrode 16. Here, when the body contact region 26 is formed by a photolithography technique without forming the body trench, the following circumstance occurs due to misalignment; for example, the body contact region 26 becomes too close to, or too far from, the gate electrode 16. When this is the case, the power MISFET may not be able to perform uniform device operations.

With the method in which the p-type impurity is implanted over the entire surface of the semiconductor substrate 10 as in the first preferred embodiment, however, misalignment does not occur, and it is possible to form the body contact region 26 to be aligned with the gate electrodes 16. In particular, when used for a product that requires high avalanche resistance, a p-type impurity, which has the same conductivity type as that of the channel forming region 22, may be additionally ion-implanted to obtain an optimum concentration for desired device characteristics.

Figure 20:
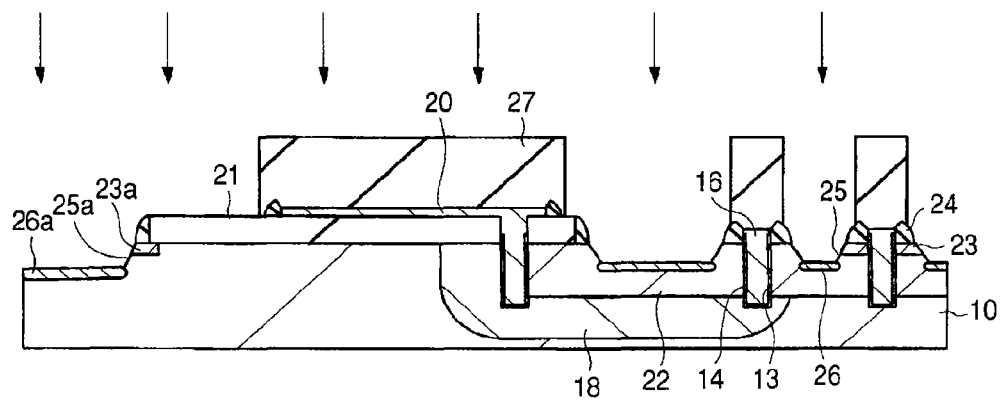
FIG. 20 is a cross-sectional view illustrating a manufacturing process of the semiconductor device subsequent to the manufacturing process shown in FIG. 19.

Here, since the p-type impurity is ion-implanted over the entire surface of the semiconductor substrate 10, the p-type impurity is also implanted into a top portion of each gate electrode 16 and the gate extension electrode 20. Each gate electrode 16 and the gate extension electrode 20 are formed of a polysilicon film in which the n-type impurity is added at a high concentration; therefore, if a p-type impurity, which has the opposite conductivity type, is implanted at a high concentration here, it is possible that the gate resistance may increase. In the case where this risk reaches to the level which may cause problems in terms of the device characteristics, a resist film 27 may be formed over the gate electrode 16 and the gate extension electrode 20, as shown in FIG. 20, and the ion implantation may be carried out in that state.

Figure 21:
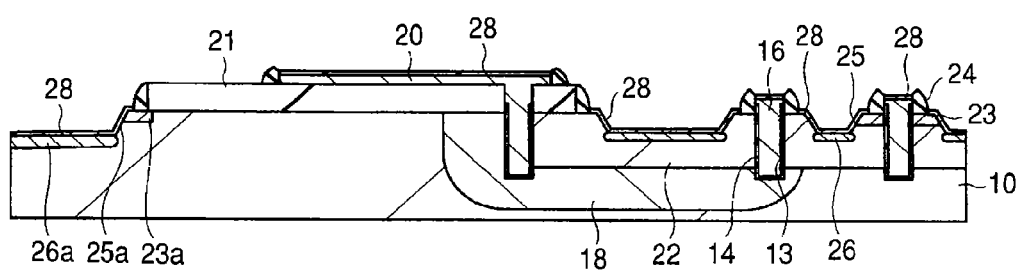
FIG. 21 is a cross-sectional view illustrating a manufacturing process of the semiconductor device subsequent to the manufacturing process shown in FIG. 20.

Next, a cobalt film is formed over the entire surface of the main surface of the semiconductor substrate 10 using, for example, a sputtering technique. Thereafter, as shown in FIG. 21, a cobalt silicide film 28 (first metal silicide film) is formed over the surfaces of the gate electrode 16, the gate extension electrode 20, and the body trench 25 by annealing the semiconductor substrate 10. Specifically, silicon and a cobalt films are directly in contact with each other at the surfaces of the gate electrode 16, the gate extension electrode 20, and the body trench 25, and therefore, the silicon and the cobalt films react with each other by the annealing, forming the cobalt silicide film 28. In this way, the cobalt silicide film 28 can be formed over the gate electrode 16. Therefore, it is possible to suppress the increase in the gate resistance of the gate electrode 16 because of the shrinkage of the gate trench 13, which is associated with miniaturization. That is, due to miniaturization, the width of the gate trench 13, in which the gate electrode 16 is formed, correspondingly becomes narrower. This may lead to an increase in the gate resistance of the gate electrode 16, which is formed of a polysilicon film. According to the first preferred embodiment, however, the cobalt silicide film 28 with a low resistance is formed over the surface of the gate electrode 16, so even when the width of the gate trench 13 becomes narrower because of miniaturization, it is possible to suppress an increase in the gate resistance. In other words, the side effect of the gate electrode increase arising from miniaturization can be eliminated.

In the first preferred embodiment, the body trench 25 is formed by self-alignment with the gate electrode 16. The source region 23 is exposed in the side surface of the body trench 25, and the body contact region 26 is formed at a bottom portion of the body trench 25. Consequently, the source region 23 and the body contact region 26 are exposed in the surface of the body trench 25, so both regions can be reliably coupled to each other by the cobalt silicide film 28 formed over the surface of the body trench 25. It should be noted that although the first preferred embodiment has described an example in which the cobalt silicide film 28 is formed, it is also possible to form a titanium silicide film or a nickel silicide film in place of the cobalt silicide film 28.

Figure 22:
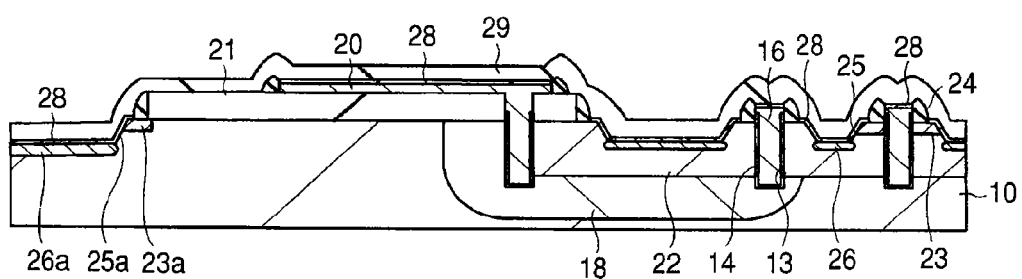
FIG. 22 is a cross-sectional view illustrating a manufacturing process of the semiconductor device subsequent to the manufacturing process shown in FIG. 21.
Figure 23:
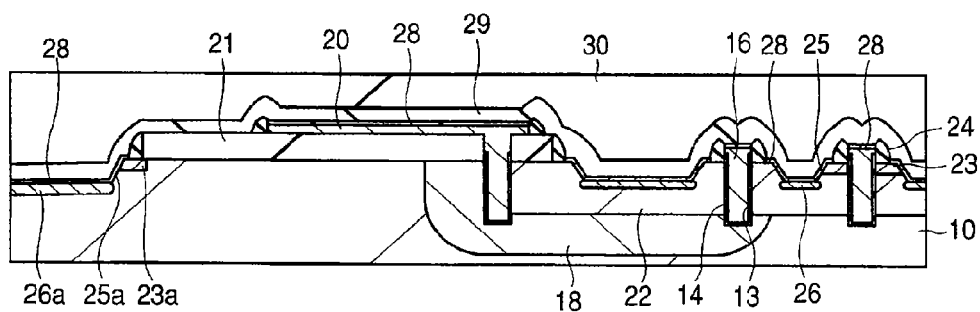
FIG. 23 is a cross-sectional view illustrating a manufacturing process of the semiconductor device subsequent to the manufacturing process shown in FIG. 22.

Next, as shown in FIG. 22, a silicon nitride film 29 (first interlayer insulating film) is formed over the semiconductor substrate. The silicon nitride film 29 can be formed using, for example, a CVD technique. Then, as shown in FIG. 23, a silicon oxide film 30 (second interlayer insulating film) is formed over the silicon nitride film 29. The silicon oxide film 30 can be formed using, for example, a CVD technique. Thereafter, the surface of the silicon oxide film 30 is planarized by polishing with a CMP technique.

Figure 24:
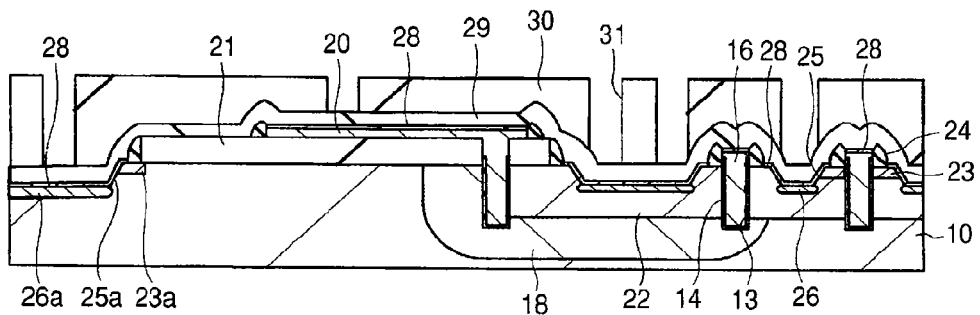
FIG. 24 is a cross-sectional view illustrating a manufacturing process of the semiconductor device subsequent to the manufacturing process shown in FIG. 23.

Subsequently, as shown in FIG. 24, holes 31 are formed in the silicon oxide film 30 using a photolithography technique and an etching technique. When etching the silicon oxide film 30, the silicon nitride film 29 formed below the silicon oxide film 30 is not etched. Thus, the silicon nitride film 29 serves as an etch stopper in forming the holes 31 in the silicon oxide film 30.

Figure 25:
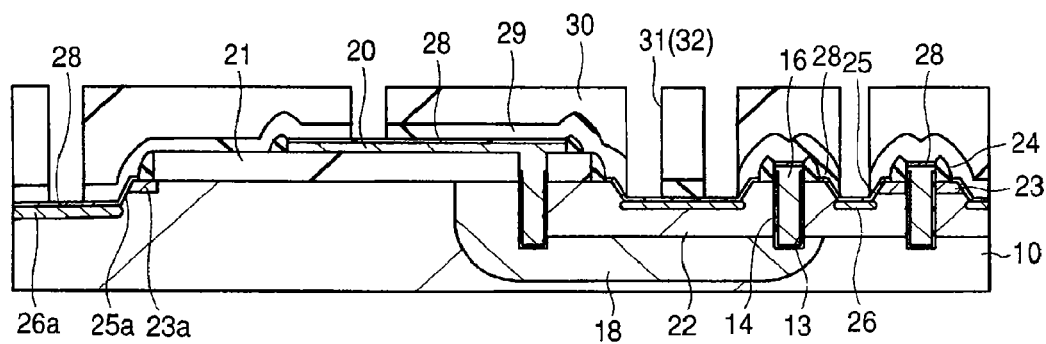
FIG. 25 is a cross-sectional view illustrating a manufacturing process of the semiconductor device subsequent to the manufacturing process shown in FIG. 24.

Next, as shown in FIG. 25, the silicon nitride film 29 that is exposed in the bottom surfaces of the holes 31 is etched using an etching technique. Thereby, contact holes 32 reaching the surface of the semiconductor substrate 10 can be formed. When etching the silicon nitride film 29, the sidewalls 24 made of a silicon oxide film cannot be etched. Thus, the sidewalls 24 formed of a silicon oxide film function as etch stoppers in etching the silicon nitride film 29. This can prevent the sidewalls 24 from being etched away and bringing the contact holes 32 and the gate electrodes 16 into contact with each other. In other words, by forming interlayer insulating films from the silicon oxide film 30 and the silicon nitride film 29 and etching the films one after the other, the contact holes 32 can be formed so as to be aligned with the gate electrodes 16. As a result, it is possible to prevent the contact holes 32, and the gate electrodes 16 from being contact with each other. This technique is what is called SAC.

For example, when the interlayer insulating film is formed only of the silicon oxide film, the contact holes are formed by etching this silicon oxide film. In this case, if misalignment occurs when forming the contact holes, the sidewalls are also etched away since the sidewalls are also formed of the silicon oxide film. This means that the risk of making the gate electrodes and the contact holes in contact increases. In contrast, according to the foregoing SAC technique, the sidewalls 24 formed of the silicon oxide film are not etched away when etching the silicon nitride film 29. As a result, even if the positions where the contact holes 32 are formed are misaligned, the gate electrodes 16 and the contact holes 32 are prevented from coming into contact with each other since the sidewalls 24 serve as an etch stopper.

Figure 26:
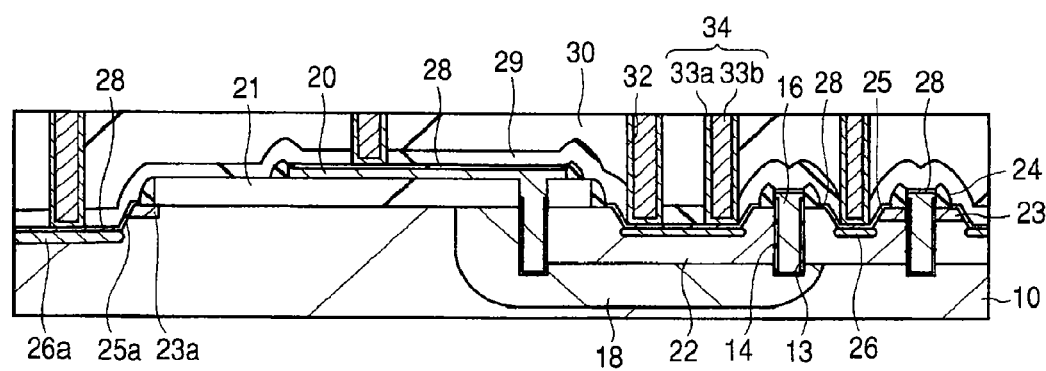
FIG. 26 is a cross-sectional view illustrating a manufacturing process of the semiconductor device subsequent to the manufacturing process shown in FIG. 25.

Subsequently, as shown in FIG. 26, a titanium/titanium-nitride film 33a is formed over the silicon oxide film 30 including the bottom surface and the inner wall of each of the contact holes 32. The titanium/titanium-nitride film 33a is made of a laminated film of a titanium film and a titanium nitride film. The titanium/titanium-nitride film 33a can be formed using a sputtering technique. This titanium/titanium nitride film 33a has what is called barrier properties for preventing, for example, tungsten, which is a material of a film for filling the holes, from diffusing into silicon.

Subsequently, a tungsten film 33b is formed over the entire surface of the main surface of the semiconductor substrate 10 so as to fill up the contact holes 32. The tungsten film 33b can be formed using, for example, a CVD technique. Then, unnecessary portions of the titanium/titanium nitride film 33a and the tungsten film 33b formed over the silicon oxide film 30 are removed, whereby the plugs 34 can be formed.

Thereafter, as shown in FIG. 3, an aluminum film is formed over the silicon oxide film 30 and the plugs 34. This aluminum film can be formed using, for example, a sputtering technique. Subsequently, the aluminum film is patterned by using a photolithography technique and an etching technique to form the source pad 1, the gate wire 2, and the guard ring 4. Note that although not shown in FIG. 3, a gate pad is also formed. In this way, the power MISFET according to the first preferred embodiment can be formed.

Figure 27:
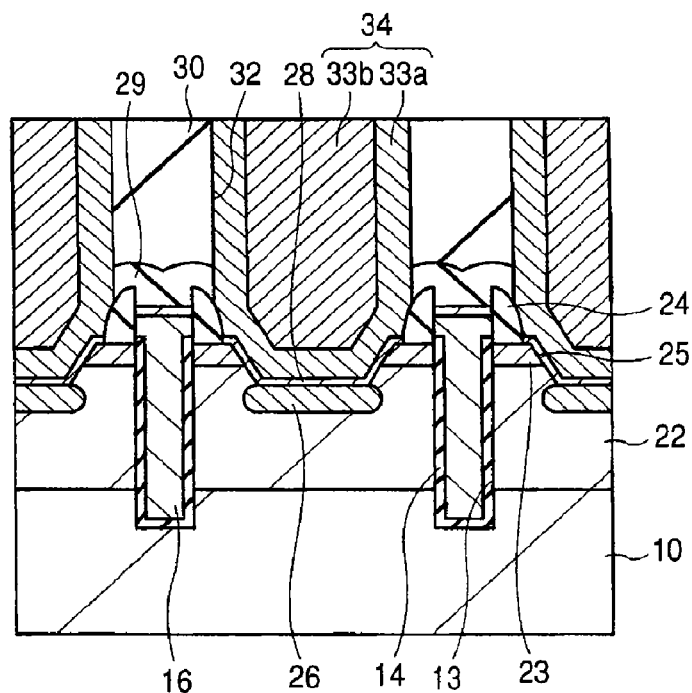
FIG. 27 is an enlarged view illustrating how a plug and the semiconductor substrate are in contact with each other in a power MISFET.

Next, FIG. 27 is an enlarged view illustrating how a plug 34 and the semiconductor substrate 10 are in contact with each other. As shown in FIG. 27, the plug 34 is formed between the adjacent gate electrodes 16. This plug 34 is formed using the above-described SAC technique; therefore, the sidewalls 24 are not etched when forming the plug 34, and the plug 34 is formed by self-alignment with the gate electrode 16. Thus, owing to the SAC technique, even when the plug 34 has such a width as to come in contact with the sidewalls 24, the sidewalls 24 are not scraped and the gate electrodes 16 and the plug 34 are prevented from being in contact with each other. That is, it becomes possible to not only etch the contact holes 32 using an oversized mask but also to alleviate the limitation due to the alignment accuracy originating from the photolithography technique. Thereby, the occupied area of the unit cell can be easily reduced. Specifically, the distance between the gate electrodes 16 can be reduced to such an extent that the plug 34 may have a width that allows contact with the sidewalls 24. Hence, the invention has an advantage that it can improve the cell density without increasing the contact resistance of the plug 34.

Furthermore, the use of the SAC technique for the formation of the plugs 34 can prove more effective when the formation of the body trench 25 by self-alignment with the gate electrodes 16 and the formation of the cobalt silicide film 28 over the body trench 25 are implemented together with the use of the SAC technique. That is, by using the SAC technique for the formation of the plugs 34, the plugs 34 are formed by self-alignment with the gate electrodes 16. Likewise, the body trench 25 is also formed by self-alignment with the gate electrodes 16. Accordingly, the source region 23 exposed in the side surface of the body trench 25 and the body contact region 26 formed at a bottom portion of the body trench 25 are coupled to the plug 34 in a self-aligned manner. As a result, it becomes possible to couple the source region 23, the body contact region 26, and the plug 34 to one another reliably. Moreover, the cobalt silicide film 28 is formed over the surface of the body trench 25, and the source region 23 and the body contact region 26 are electrically coupled to each other via this cobalt silicide film 28. For example, even if a plug 34 is misaligned and consequently coupled only to either one of the body contact region 26 or the source region 23 exposed in the body trench 25, the plug 34 can be electrically coupled to the source region 23 and the body contact region 26 because the plug 34 is coupled to the cobalt silicide film 28. Furthermore, since the plug 34 is coupled to the cobalt silicide film 28, contact resistance can be reduced and the on-state resistance can be lowered.

Figure 28:
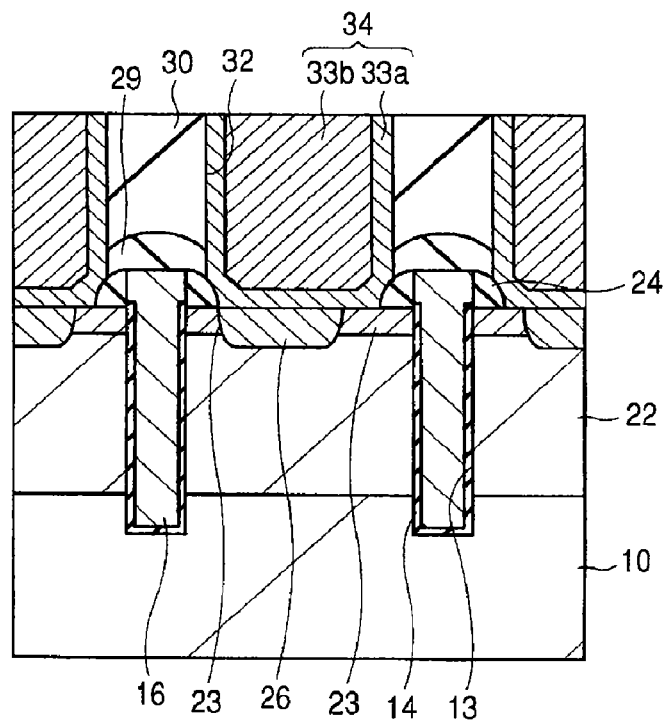
FIG. 28 is a view illustrating an example in which the plugs are formed by an SAC technique but the body contact region is formed by a photolithography technology.

Here, for the purpose of comparison, FIG. 28 shows an example in which the plug 34 is formed by the SAC technique but the body contact region 26 is formed by a photolithography technique. In FIG. 28, the plug 34 is formed by self-alignment with the gate electrodes 16. On the other hand, the body contact region 26 is formed by a photolithography technique and is therefore assumed to be misaligned. At this time, it is possible that one of the source regions 23, which are formed adjacent to both sides of the body contact region 26, is formed directly below a sidewall 24, which can result in the condition in which the source region 23 is not exposed from the semiconductor substrate 10. This means that even if the plug 34 is formed by self-alignment with the gate electrodes 16, the plug 34 cannot be electrically coupled to the source region 23 that is formed only directly below the sidewall 24.

In contrast, in the first preferred embodiment, the body trench 25 is formed by self-alignment with the gate electrodes 16 and the cobalt silicide film 28 is formed over the surface of the body trench 25. Therefore, unlike the configuration that has been compared above, the source region 23 is prevented from failing to be electrically coupled to the plug 34. In this way, by using the SAC technique for the formation of the plug 34, also forming the body trench 25 by self-alignment with the gate electrodes 16, and moreover forming the cobalt silicide film 28 over the surface of the body trench 25, the reliability of the power MISFET can be improved without being restricted by the photolithography technique. In particular, since the plug 34 is formed by SAC and the body trench 25 is formed by self-alignment with the gate electrodes 16, a highly symmetrical power MISFET can be achieved. As a result, the device operations become uniform, and it becomes possible to improve the resistance to avalanche breakdown or the like.

Figure 29:
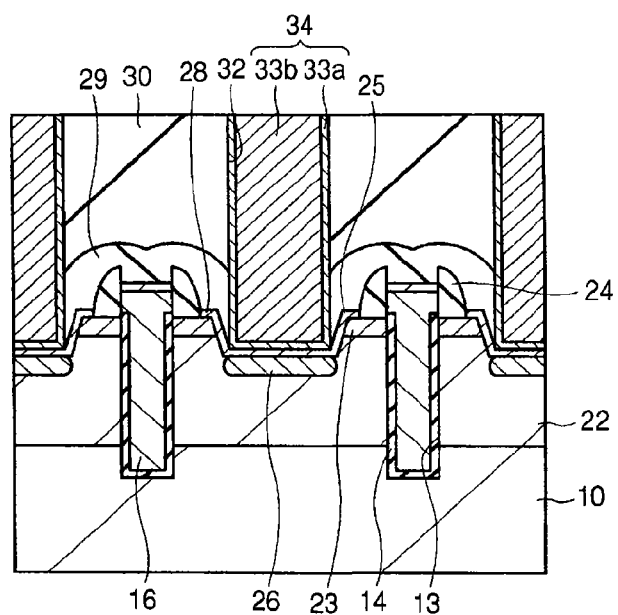
FIG. 29 is a view illustrating a case in which the width of a plug is narrower than the width of the gap between its adjacent sidewalls.

In addition, another advantage will be discussed. FIG. 29 is a view illustrating a case in which the width of a plug 34 is narrower than the width of the gap between its adjacent sidewalls 24. In this case, depending on the width of the plug 34, it is possible that the plug 34 is not coupled to both of the body contact region 26 and the source region 23. FIG. 29 shows a case in which the plug 34 is coupled only to the body contact region 26. Even in such a case, the body contact region 26 and the source region 23 are coupled to each other by the cobalt silicide film 28 formed over the surface of the body trench 25. This means that even when the plug 34 is not directly coupled to the source region 23, the plug 34 and the source region 23 are indirectly coupled to each other via the cobalt silicide film 28. From this, it will be appreciated that, according to the first preferred embodiment, no problem arises even when the plug 34 is not directly coupled to the source region 23.

In addition, since the cobalt silicide film 28 is formed over the source region 23 and the body contact region 26, the resistance in each of the regions can be reduced.

As has been described above, one of the features of the first preferred embodiment is that the SAC technique is used for the formation of the plug 34, also the body trench 25 is formed by self-alignment with the gate electrodes 16, and the cobalt silicide film 28 is formed over the surface of the gate electrodes 16 and the body trench 25. Although such a configuration is desirable, part of the advantage according to the first preferred embodiment may be obtained even by only the use of the SAC technique for forming the plug 34. In addition, part of the advantage according to the first preferred embodiment may be obtained even with the use of technique of forming the body trench 25 by self-alignment with the gate electrodes 16 and forming the cobalt silicide film 28 over the surface of the gate electrode 16 and the body trench 25.

(Second Preferred Embodiment) A second preferred embodiment describes an example in which the source region is formed from a shallow source extension region and a deep source diffusion region. First, a manufacturing method of a power MISFET according to the second preferred embodiment is described with reference to the drawings.

Figure 30:
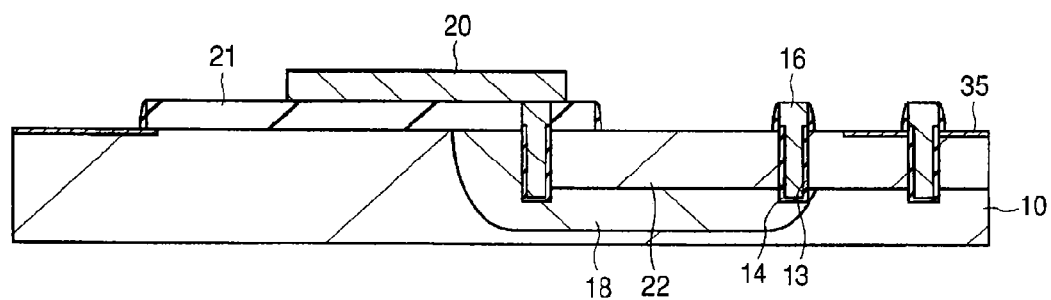
FIG. 30 is a cross-sectional view illustrating a manufacturing process of the semiconductor device according to a second preferred embodiment.

The process steps from FIG. 5 through FIG. 15 are the same as described in the first preferred embodiment. Subsequently, as shown in FIG. 30, a source extension region 35 (first source region) the formation position of which is shallow is formed adjacent to a gate electrode 16 in the cell region (active cell) using a photolithography technique and an ion implantation technique. The source extension region 35 is a semiconductor region doped with an n-type impurity.

Figure 31:
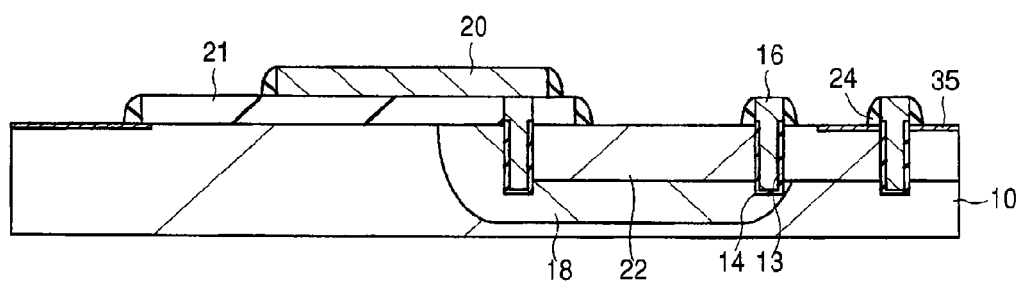
FIG. 31 is a cross-sectional view illustrating a manufacturing process of the semiconductor device subsequent to the manufacturing process shown in FIG. 30.
Figure 32:
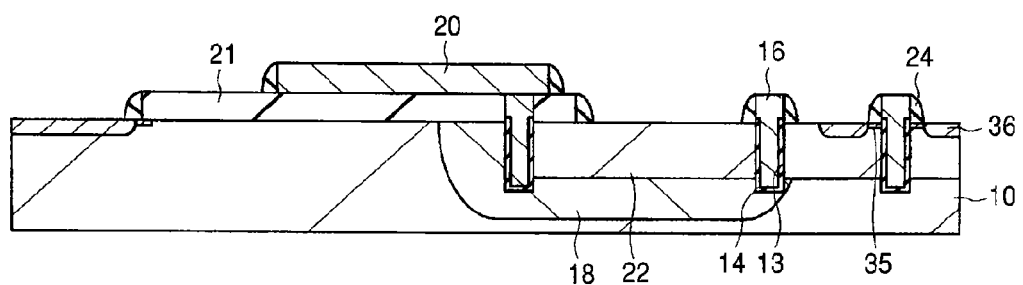
FIG. 32 is a cross-sectional view illustrating a manufacturing process of the semiconductor device subsequent to the manufacturing process shown in FIG. 31.

Next, as shown in FIG. 31, a silicon oxide film is formed over the entire surface of the main surface of the semiconductor substrate 10, and thereafter, the sidewall 24 is formed on the side wall portion of the gate electrode 16 by anisotropic dry etching. Then, as shown in FIG. 32, a source diffusion region 36 (second source region) the formation position of which is deep is formed adjacent to the sidewall 24, using a photolithography technique and an ion implantation technique. The source diffusion region 36 is a semiconductor region doped with an n-type impurity. The subsequent process steps are the same as described in the first preferred embodiment. Finally, a power MISFET as shown in FIG. 33 can be formed.

Figure 33:
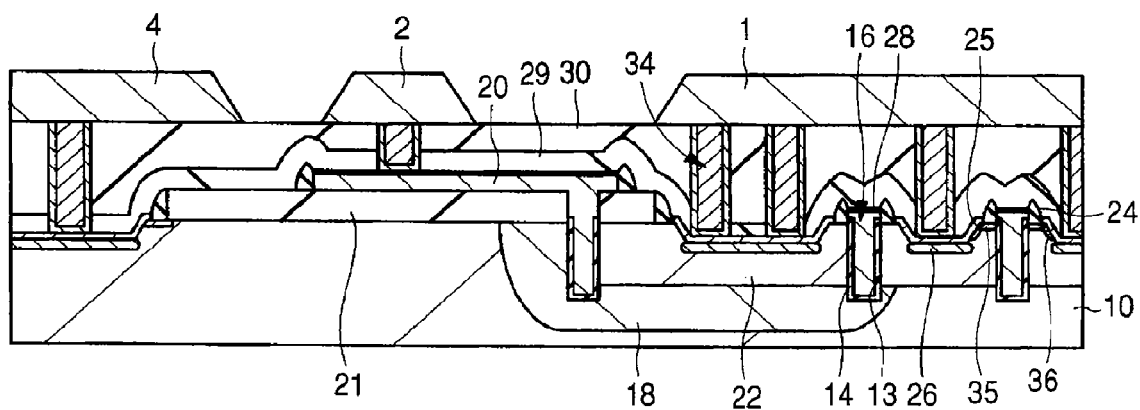
FIG. 33 is a cross-sectional view illustrating a manufacturing process of the semiconductor device subsequent to the manufacturing process shown in FIG. 32.

As illustrated in FIG. 33, the source extension region is formed in a region adjacent to the gate electrode 16, and the source diffusion region 36 is formed outward of and adjacent to this source extension region 35. The body trench is formed by self-alignment with the gate electrodes 16, and the source diffusion region 36 is exposed in a side surface of this body trench 25. The cobalt silicide film 28 is directly in contact with the exposed portion of the source diffusion region 36. Here, the region exposed in the side surface of the body trench 25 is not the shallow source extension region but the deep source diffusion region 36. Therefore, a sufficient contact area can be ensured between the cobalt silicide and the source diffusion region 36. As a result, the resistance in the source diffusion region can be reduced.

In addition, the second preferred embodiment employs the structure in which the top portion of the gate electrode 16 protrudes from the semiconductor substrate 10 and therefore can prevent a source offset even though the shallow source extension region 35 is formed in a region adjacent to the gate electrode 16.

Next, an advantage obtained by forming the source region from the shallow source extension region 35 and the deep source diffusion region 36 as in the power MISFET according to the second preferred embodiment is discussed with reference to the drawings.

Figure 34:
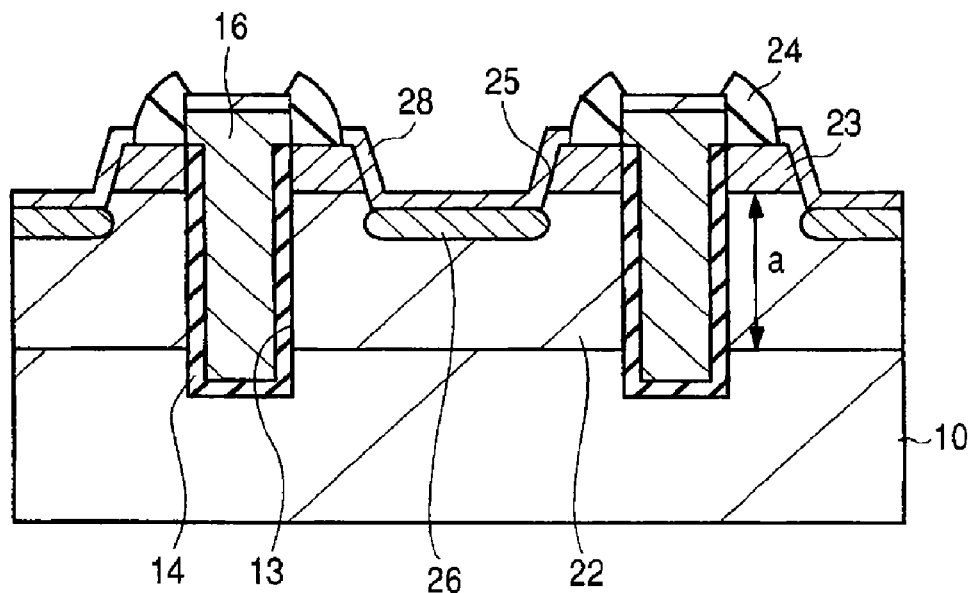
FIG. 34 is a cross-sectional view illustrating a semiconductor device according to the first preferred embodiment.
Figure 35:
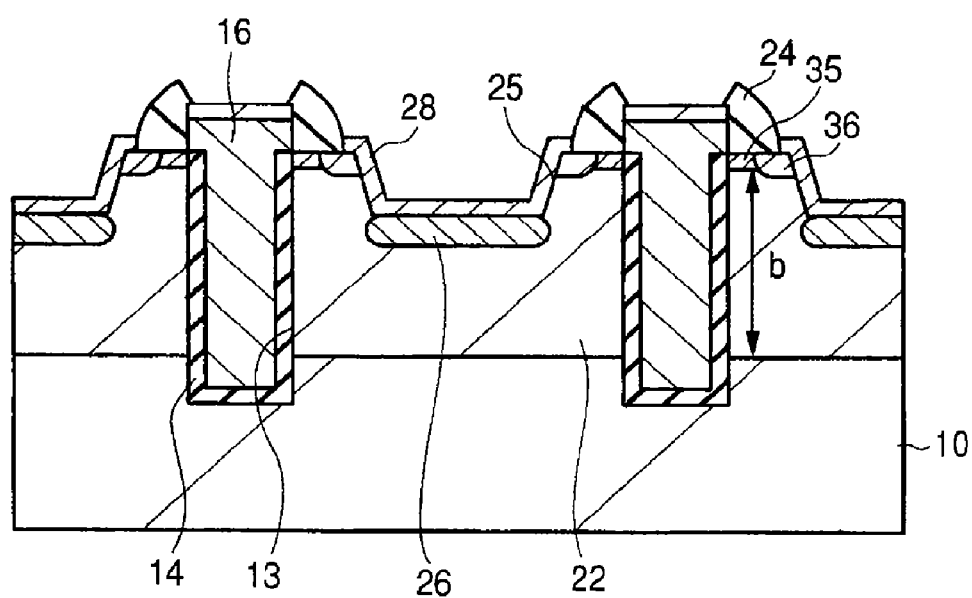
FIG. 35 is a cross-sectional view illustrating a semiconductor device according to the second preferred embodiment.

FIG. 34 is a cross-sectional view illustrating a power MISFET comprising one source region 23, as in the foregoing first preferred embodiment. On the other hand, FIG. 35 is a cross-sectional view illustrating a power MISFET having a source region comprising the source extension region 35 and the source diffusion region 36, as in this second preferred embodiment. In FIG. 34, the channel length between the source region 23 and the drain region (the semiconductor substrate 10) is a. On the other hand, in FIG. 35, the channel length of the channel formed near the side wall portion of the gate electrode 16 is b. In other words, the channel length between the source extension region 35 and the drain region is b. Here, the depth of the source extension region 35 shown in FIG. 35 is shallower than the depth of the source region 23 shown in FIG. 34. Therefore, the channel length b shown in FIG. 35 is longer than the channel length a shown in FIG. 34. As a result, the power MISFET shown in FIG. 35 is less likely to suffer from punch through than the power MISFET shown in FIG. 34. In other words, by forming the source extension region 35 positioned in a shallow region, punch-through resistance can be improved. In other words, in the structure shown in FIG. 35, in which the source extension region 35 is provided, the length of the gate trench 13 can be made shorter if the desired punch-through resistance is at the same level as that of the structure shown in FIG. 34. That is, it is possible to achieve size reduction (shrinkage) of the power MISFET in the vertical direction in the structure in which the source extension region 35 is provided. For this reason, it becomes possible to reduce the on-state resistance of the power MISFET. As has been described above, the second preferred embodiment has an advantage that the size reduction (shrinkage) in the vertical direction can be achieved in addition to the size reduction (shrinkage) in the horizontal direction, as obtained by the first preferred embodiment.

Next, a variation of the ion implantation technique for forming the source extension region 35 and the source diffusion region 36 will be described. In the step of ion implantation for forming the source extension region 35 and the source diffusion region 36, the ion implantation is not limited to the ion implantation method normally used, in which ions are implanted in a perpendicular direction to the semiconductor substrate; it is possible to use an ion implantation method in which ions are implanted in a diagonal direction with respect to the semiconductor substrate surface. The ion species is not limited to arsenic (As) and phosphorus (P) but may also be antimony (Sb). In the ion implantation technique in a diagonal direction, the amount (dose) of ions to be implanted is about, for example, from $1 \times 10^{14}$ to $5 \times 10^{15}$, and it is desirable that the dose should be as high as possible. The ion implantation method in a diagonal direction may be carried out by a step implantation method, in which the total dose is divided equally into multiple doses and the semiconductor substrate is rotated each time one divided dose has been implanted, or a rotation implantation method, in which the ion implantation is performed while the semiconductor substrate is being rotated at a constant speed. The inclination angle may be within the range of from greater than 0 degrees to 45 degrees or less. The angle represents an angle with respect to the perpendicular direction to the main surface of the semiconductor substrate. The method of ion-implanting in a diagonal direction in this way has the advantages as follows, in comparison with the case in which the ion implantation is performed in the vertical direction.

When an extremely shallow junction such as the source extension region 35 is formed by an ion implantation technique, it becomes difficult to achieve the shallow junction uniformly because of the diffusion of the impurity ions originating from the channeling in the ion implantation. The method of implanting ions in a diagonal direction, however, can suppress this channeling and is therefore capable of reducing variations in the depth of the source extension region 35.

Figure 36:
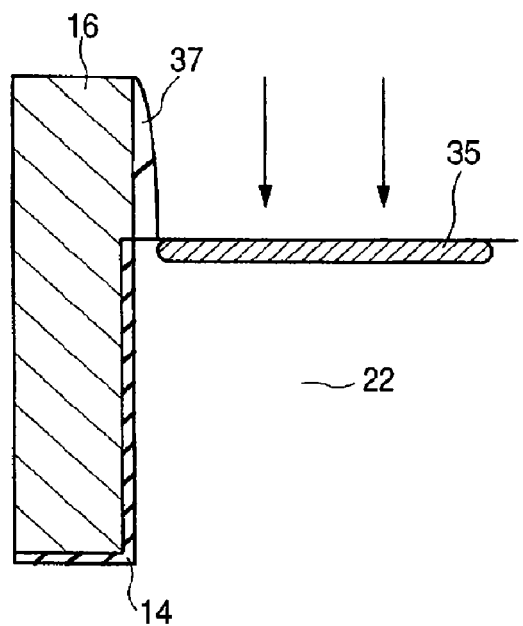
FIG. 36 is a view illustrating a case in which ions are implanted into a source extension region in a vertical direction.

When employing a low heat load annealing such as RTA (Rapid Thermal Annealing) after the ion implantation in order to achieve an extremely shallow junction such as the source extension region 35, it is possible that the source offset structure as shown in FIG. 36 may be formed because of the features of the device structure. FIG. 36 shows a case in which the ion implantation is carried out in the vertical direction. As shown in FIG. 36, when the ion implantation is carried out in the vertical direction, a gap (source offset) may be produced between the gate electrode 16 and the source extension region 35 since a very small sidewall 37 is formed on the side wall portion of the gate electrode 16. In other words, when ions are implanted in the perpendicular direction, ions cannot be implanted in the region that is in contact with the gate electrode 16 because the sidewall 37 exists above the region that is in contact with the gate electrode 16. Furthermore, since the annealing is conducted by a low heat load annealing to achieve an extremely shallow junction, impurity diffusion does not occur so much. Specifically, impurity diffusion takes place due to the annealing after the ion implantation, but in the second preferred embodiment, the impurity does not diffuse to the contact region with the gate electrode 16 because the annealing is carried out by a low heat load annealing. For these reasons, there is a risk that a source offset occurs. If a source offset occurs, the problem of large on-state resistance arises.

Figure 37:
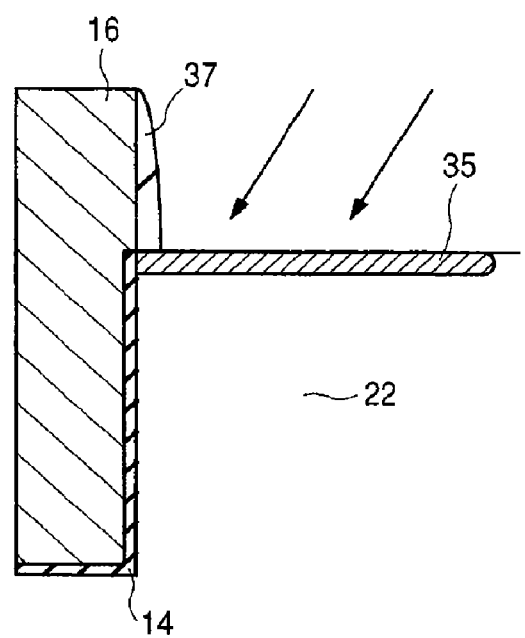
FIG. 37 is a view illustrating a case in which ions are implanted into the source extension region in a diagonal direction.

In view of this, it is conceivable that the ion implantation should be carried out in a diagonal direction, as shown in FIG. 37. By carrying out the ion implantation in a diagonal direction, the ions are implanted so as to get under the sidewall 37 formed on the side wall portion of the gate electrode 16. Thus, there is an advantage that the source extension region 35 is formed also in the region that is in contact with the gate electrode 16 and that the source offset can be prevented without enhancing the annealing.

Figure 38:
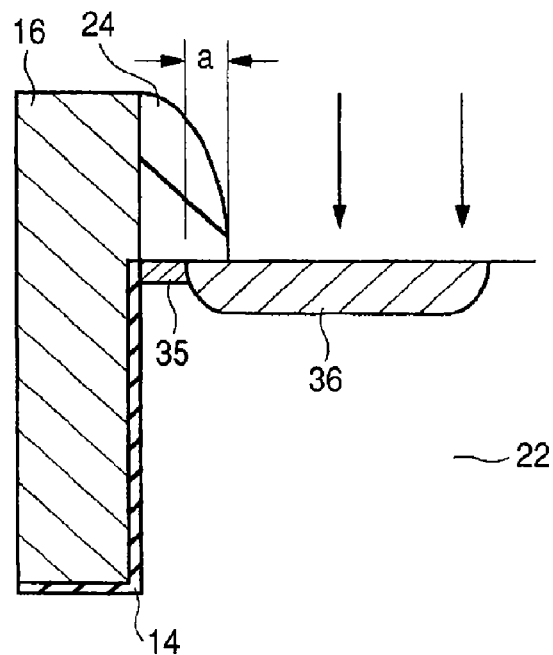
FIG. 38 is a view illustrating a case in which ions are implanted into a source diffusion region in a vertical direction.

Furthermore, the source diffusion region 36 may also be ion-implanted in a diagonal direction. The advantages obtained in this case will be discussed. FIG. 38 is a cross-sectional view illustrating a case in which the source diffusion region 36 is formed by an ion implantation in the vertical direction. As illustrated in FIG. 38, the sidewall 24 is formed on a side wall portion of the gate electrode 16, and the source diffusion region 36 is formed so as to be aligned with the sidewall 24. This source diffusion region 36 is formed after the sidewall 24 has been formed and is therefore not formed directly below the sidewall 24. However, because of the annealing after the ion implantation, the ions diffuse under the sidewall 24. By this annealing, the source diffusion region 36 gets under the sidewall 24 by a distance a.

Figure 39:
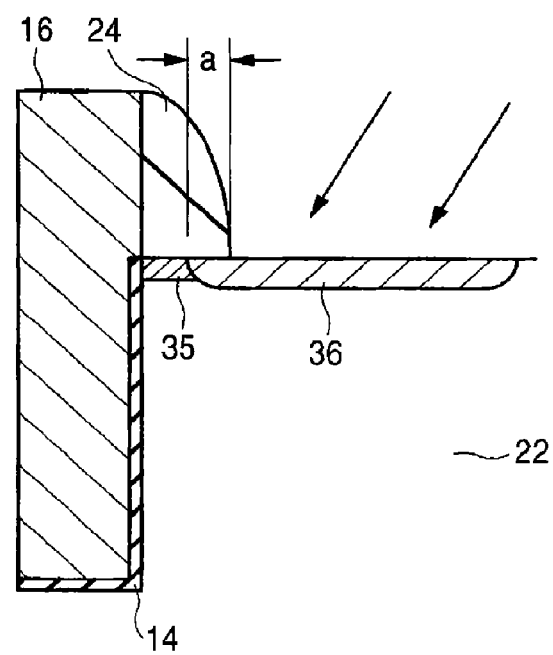
FIG. 39 is a view illustrating a case in which ions are implanted into the source diffusion region in a diagonal direction.

In contrast, FIG. 39 shows a cross-sectional view illustrating a case in which the source diffusion region 36 is formed by an ion implantation in a diagonal direction. In this case, since the ion implantation is carried out in a diagonal direction, the source diffusion region 36 is also formed directly below the sidewall 24 at the time of the ion implantation. Thus, the impurity can be diffused to the region denoted as a under the sidewall 24 with a less heat quantity in annealing than the case shown in FIG. 38, in which ions are implanted in the perpendicular direction. That is, when the ion implantation is carried out in a diagonal direction, the source diffusion region 36 can be brought close to the gate electrode 16 side with a less heat quantity in annealing, and an increase in the source resistance can be prevented.

Thus, the second preferred embodiment makes it possible to reduce the size of the device structure in the perpendicular direction and to reduce the heat quantity applied to the semiconductor substrate. Since the heat quantity applied to the semiconductor substrate can be reduced, it becomes easy to use a semiconductor substrate doped with phosphorus at a high concentration as the n-type semiconductor substrate in place of the semiconductor substrate doped with arsenic at a high concentration. A problem with the use of the semiconductor substrate doped with phosphorus at a high concentration is that the diffusion constant of phosphorus is about ten times greater than that of arsenic. For this reason, when the heat quantity (thermal budget) in the manufacturing process cannot be reduced, phosphorus diffuses from the semiconductor substrate greatly because of the annealing. Accordingly, in order to ensure a withstand voltage between the source region and the drain region, it is necessary to have a thick n-type epitaxial layer, and the on-state resistance needs to be sacrificed.

Nevertheless, the use of the semiconductor substrate doped with phosphorus at a high concentration has an advantage for the following reason. For example, phosphorus has such a characteristic that it can achieve a low resistance since phosphorus shows a greater solid solubility to silicon than arsenic and antimony. Accordingly, phosphorus has the advantage that it can reduce the on-state resistance of the device. In view of this, the second preferred embodiment makes it possible to reduce the heat quantity so that the diffusion of phosphorus can be suppressed. Therefore, the second preferred embodiment can make it easy to use the semiconductor substrate doped with phosphorus, which has the above-described advantage, while ensuring withstand voltage between the source region and the drain region.

(Third Preferred Embodiment) A third preferred embodiment describes an example in which the invention is applied to a technique for forming a power MISFET and a Schottky barrier diode in the same semiconductor chip.

Figure 40:
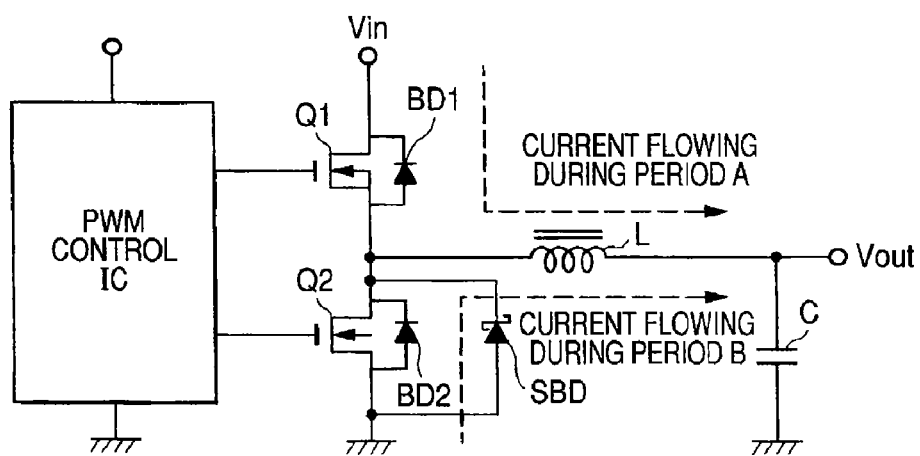
FIG. 40 is a circuit diagram of a synchronous rectifier-type DC/DC converter.
Figure 41:
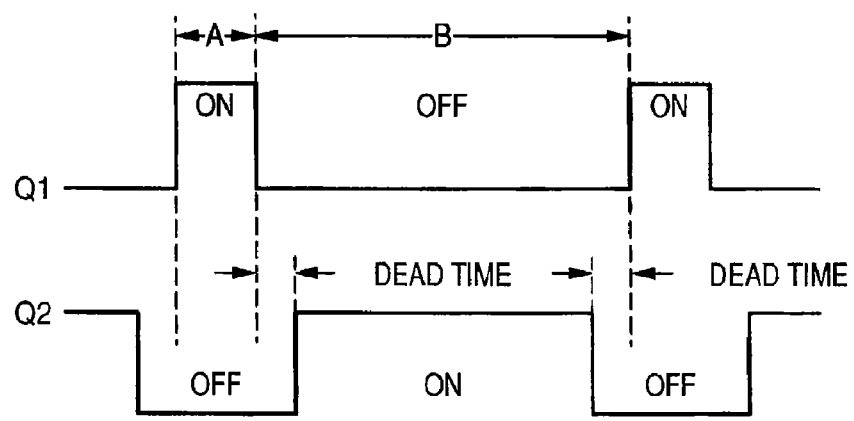
FIG. 41 is a timing chart of a main-switch power MISFET and a synchronous rectifying power MISFET.

FIG. 40 is a circuit diagram of a common synchronous rectifier-type DC/DC converter that uses power MISFETs, and FIG. 41 is a timing chart of the main-switch power MISFET Q1 and the synchronous rectifying power MISFET Q2 shown in FIG. 40. In FIG. 40, Q1 represents a main-switch power MISFET, Q2 represents a synchronous rectifying power MISFET, BD1 and BD2 represent body diodes, and SBD represents a Schottky barrier diode. Also, L represents inductance and C represents a capacitor element. The body diode BD1 and the body diode BD2 are incorporated in the main-switch power MISFET Q1 and the synchronous rectifying power MISFET Q2, respectively, and they are coupled in parallel. The Schottky barrier diode SBD is coupled in parallel to the synchronous rectifying power MISFET Q2.

The main-switch power MISFET Q1 functions as a switching element, and the synchronous rectifying power MISFET Q2 functions as an element for synchronous rectification. As shown in FIGS. 40 and 41, when the main-switch power MISFET Q1 is turned on, electric current flows from an input voltage Vin side through the main-switch power MISFET Q1 to the inductance L and the capacitor element C side, as shown in FIG. 40 (current flowing during period A). Then, when the main-switch power MISFET Q1 is turned off and the synchronous rectifying power MISFET Q2 is turned on, electric current is allowed to flow in a direction such that current reduction will not take place by the inductance L, so electric current flows from the synchronous rectifying power MISFET Q2 to the inductance L and the capacitor element C side, as shown in FIG. 40 (current flowing during period B). By repeating such an operation, a predetermined voltage is output from the input voltage.

The DC/DC converter is used, for example, for personal computers (PCs). The trends in the operating voltage of the CPUs incorporated in personal computers have been toward lower voltage and larger current. In particular, in the cases of power supplies for notebook PCs, the operating frequency also tends to be high since size reduction is considered important. As the trends toward lower voltage, larger current, and higher frequency advance in this way, it is necessary to extremely narrow the switching pulse width of the main-switch power MISFET in the on/off operation. Conversely, the on time of the synchronous rectifying power MISFET becomes about 90% of one period. Such usage requires a low switching loss for the main-switch power MISFET and at the same time a low on-state resistance for the synchronous rectifying power MISFET.

In the synchronous rectifier-type DC/DC converter shown in FIG. 40, the main-switch power MISFET Q1 and the synchronous rectifying power MISFET Q2 need to be alternately turned on and off. In order to prevent the through-current because of the simultaneous turn-on of the main-switch power MISFET Q1 and the synchronous rectifying power MISFET Q2, a period called "dead time," in which both MISFETs are turned of f, is provided, as shown in FIG. 41, and the current during that period flows in the direction indicated as the current flowing during period B in FIG. 40. Specifically, during this period, the current flows through the body diode BD2 incorporated in the synchronous rectifying power MISFET Q2, so the forward voltage drop (VF) becomes large, about 0.8 V. In view of this, the Schottky barrier diode SBD, which shows a smaller forward voltage drop (VF) than that of the body diode BD2, is coupled in parallel to the synchronous rectifying power MISFET Q2 to thereby reduce the circuit loss. In other words, the circuit loss during the dead time is reduced by making use of the fact that the Schottky barrier diode SBD has a small forward voltage drop (VF).

Accordingly, the use of a Schottky barrier diode is necessary from the viewpoint of reducing the circuit loss. In view of this, there is a semiconductor device in which a semiconductor chip containing a power MISFET and a semiconductor chip containing a Schottky barrier diode are incorporated in a single package. In this semiconductor device, the electrical coupling between the power MISFET and the Schottky barrier diode is effected by a bonding wire; therefore, the parasitic inductance increases, and the circuit efficiency of the DC/DC converter degrades. Specifically, because parasitic inductance such as a wire exists between the power MISFET and the Schottky barrier diode, electric current temporarily flows through the body diode after the power MISFET is turned off, and then commutates to the Schottky barrier diode with a delay. If this parasitic inductance is large, it not only slows down the commutation speed but also becomes a cause of noise and ripples.

In view of this, in order to reduce the parasitic inductance, there has been a technique for incorporating the Schottky barrier diode in the semiconductor chip containing the power MISFET. According to this technique, the coupling wire between the power MISFET and the Schottky barrier diode can be made smaller, so the parasitic inductance can be reduced. As a result, the time of the current flowing through the body diode of the power MISFET can be controlled, and the circuit loss during the dead time can be considerably reduced in the DC/DC converter controlled by PWM (Pulse Width Modulation) control. For these reasons, the power MISFET and the Schottky barrier diode are incorporated together in a single semiconductor chip.

Figure 42:
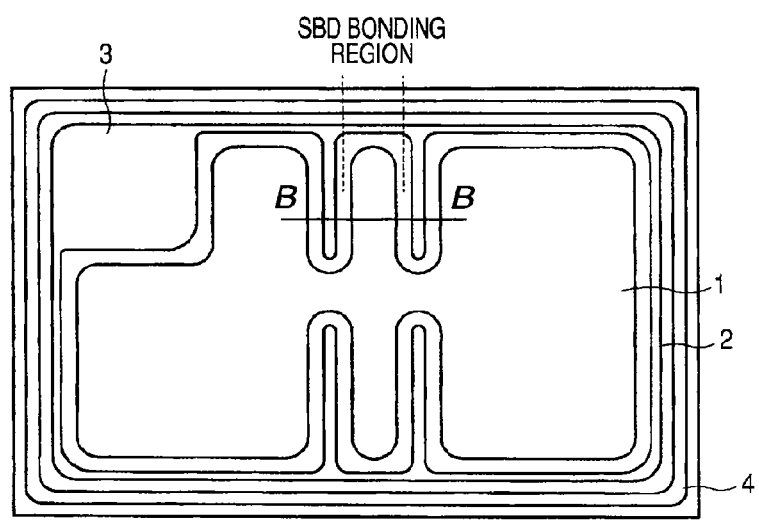
FIG. 42 is a cross-sectional view illustrating a semiconductor device according to a third preferred embodiment.

FIG. 42 is a plan view illustrating an upper surface of the semiconductor chip in which the power MISFET and the Schottky barrier diode are incorporated. The device shown in FIG. 42 has a similar same configuration to the device shown in FIG. 1 of the first preferred embodiment. What is different is that an SBD junction portion in which the Schottky barrier diode is formed is provided at a central portion of the semiconductor chip. The source pad 1 is also provided for this SBD junction portion.

Figure 43:
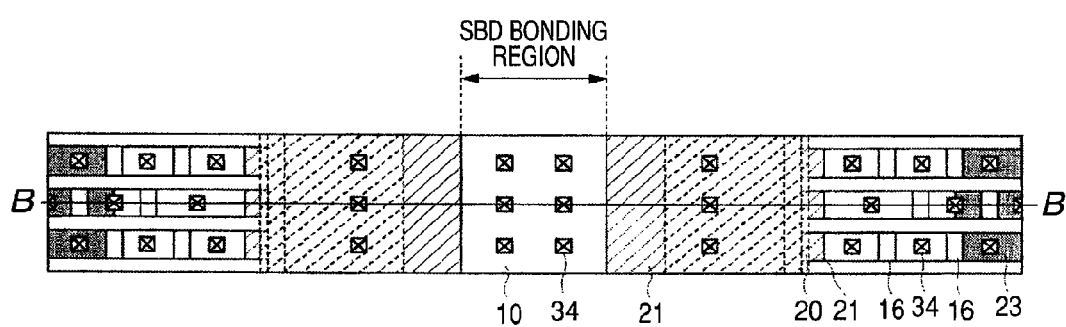
FIG. 43 is a plan view showing a portion of the planar structure of the semiconductor device according to the third preferred embodiment.

FIG. 43 is a schematic enlarged cross-sectional view taken along the line B-B in FIG. 42. FIG. 43 illustrates the structure formed in a layer that is below the surface layer shown in FIG. 42, in which the source pad 1, the gate wire 2, the gate pad 3, and the guard ring 4 are formed. In other words, it shows, in a plan view, the structure formed in a layer below the surface layer, with an interlayer dielectric film interposed therebetween. The structure also has a similar configuration as the first preferred embodiment. What is different is that an SBD junction portion is provided at its central portion.

Figure 44:
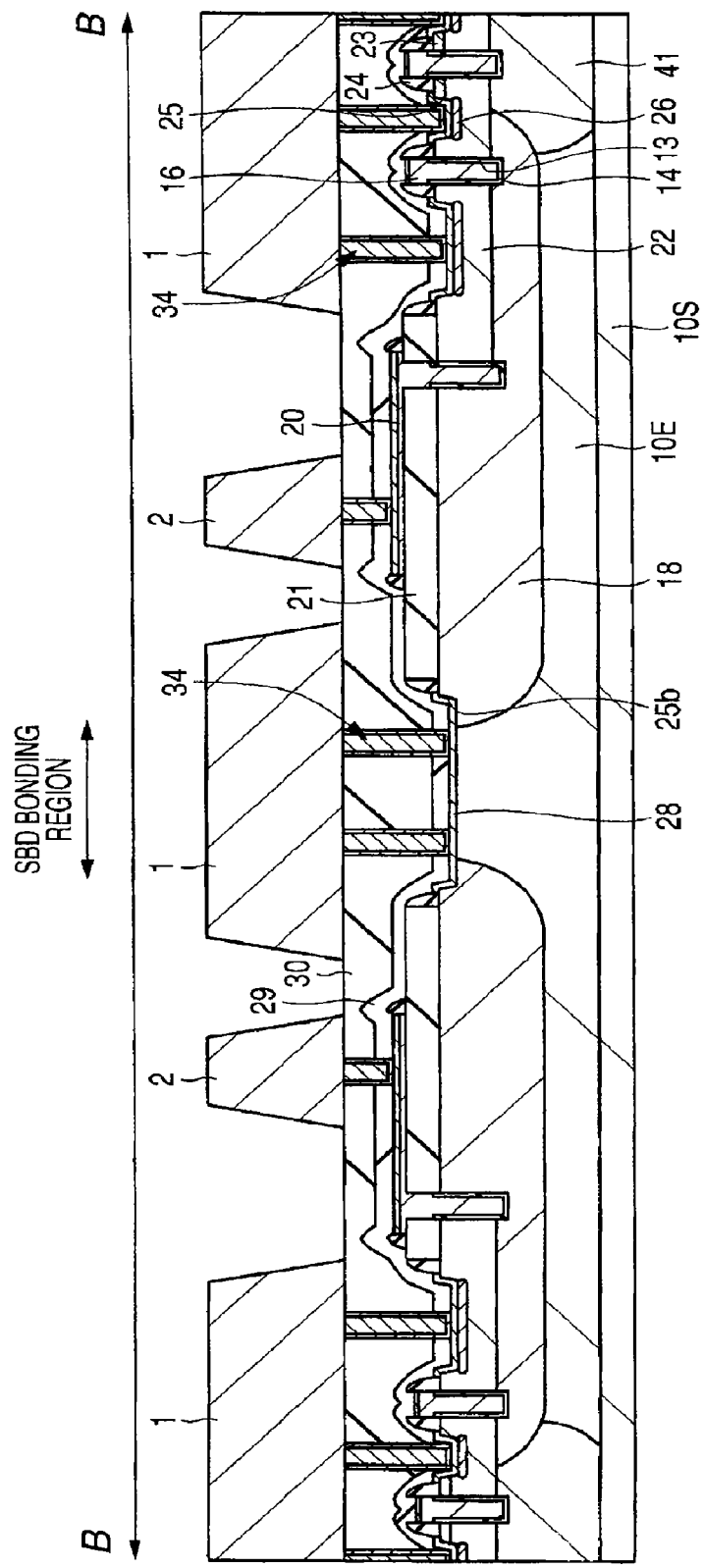
FIG. 44 is a cross-sectional view taken along the line B-B in FIG. 42.

FIG. 44 is a cross-sectional view taken along the line B-B in FIG. 42. The structure shown in FIG. 44 has a similar configuration to that shown in the foregoing first preferred embodiment. For example, the configuration of the power MISFET is the same, but what is different is that the SBD junction portion, in which a Schottky barrier diode is formed, is provided at a central portion of the semiconductor chip. The configuration of this SBD junction portion will be discussed. In the SBD junction portion, an n-type semiconductor region 10E doped with an n-type impurity at a low concentration is formed over an n-type semiconductor substrate 10S. This n-type semiconductor region 10E becomes a cathode region of the Schottky barrier diode and therefore has a lower impurity concentration than that of the n-type semiconductor region 41 in which the power MISFET is formed. A junction groove 25b is formed in the surface of the n-type semiconductor region 10E, and the cobalt silicide film 28 is formed over the surface of this junction groove 25b. As a result, a Schottky junction is formed in the region in which the cobalt silicide film 28 and the n-type semiconductor region 10E are directly in contact with each other. In other words, a Schottky barrier diode comprising the n-type semiconductor region 10E as the cathode region and the cobalt silicide film 28 as the anode region is formed. In addition, the silicon nitride film 29 is formed over the cobalt silicide film 28, and the silicon oxide film 30 is formed over this silicon nitride film 29. The plugs 34 are formed in the silicon nitride film 29 and the silicon oxide film 30 so as to pierce through these films and reach the cobalt silicide film 28. The source pad 1 is formed over these plugs 34.

The semiconductor device according to the third preferred embodiment is configured as described above. In the following, a manufacturing method of a semiconductor device that incorporates a power MISFET and a Schottky barrier diode will be described with reference to the drawings.

Figure 45:
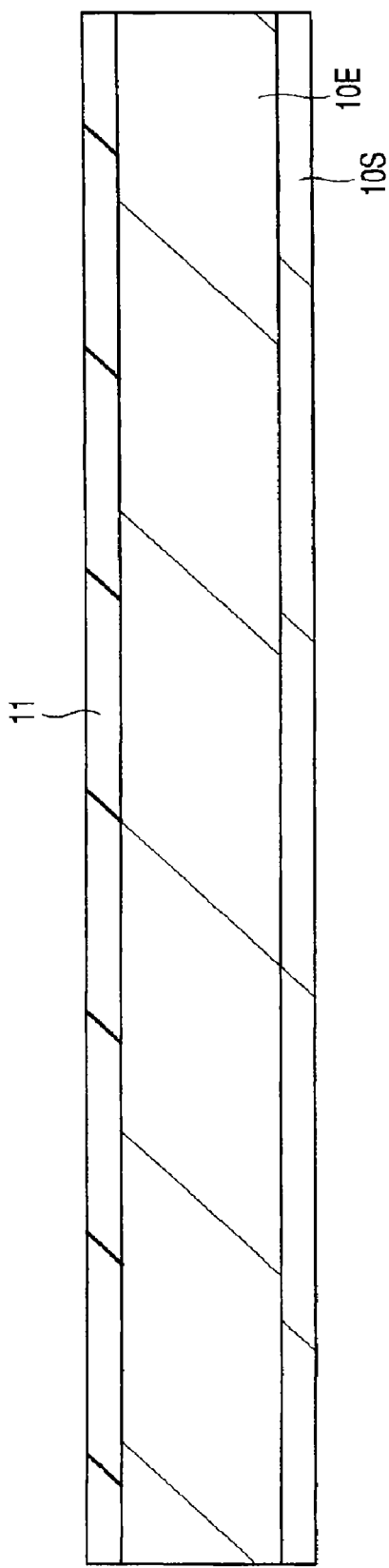
FIG. 45 is a cross-sectional view illustrating a manufacturing process of the semiconductor device according to the third preferred embodiment.

As shown in FIG. 45, using an epitaxial growth technique, the n-type semiconductor region 10E is formed over the semiconductor substrate 10S doped with an n-type impurity. The n-type semiconductor region 10E formed by the epitaxial growth technique is doped with the n-type impurity at a lower concentration than the n-type epitaxial layer in the first preferred embodiment. In the third preferred embodiment, the Schottky barrier diode is formed using this n-type semiconductor region 10E. For this reason, an n-type impurity such as phosphorus is implanted at a low concentration so that it can be a cathode of the Schottky barrier diode. Next, the insulating film 11 (first insulating film) is formed over the n-type semiconductor region 10E, using, for example, a thermal oxidation technique. This insulating film 11 is formed of, for example, a silicon oxide film.

Figure 46:
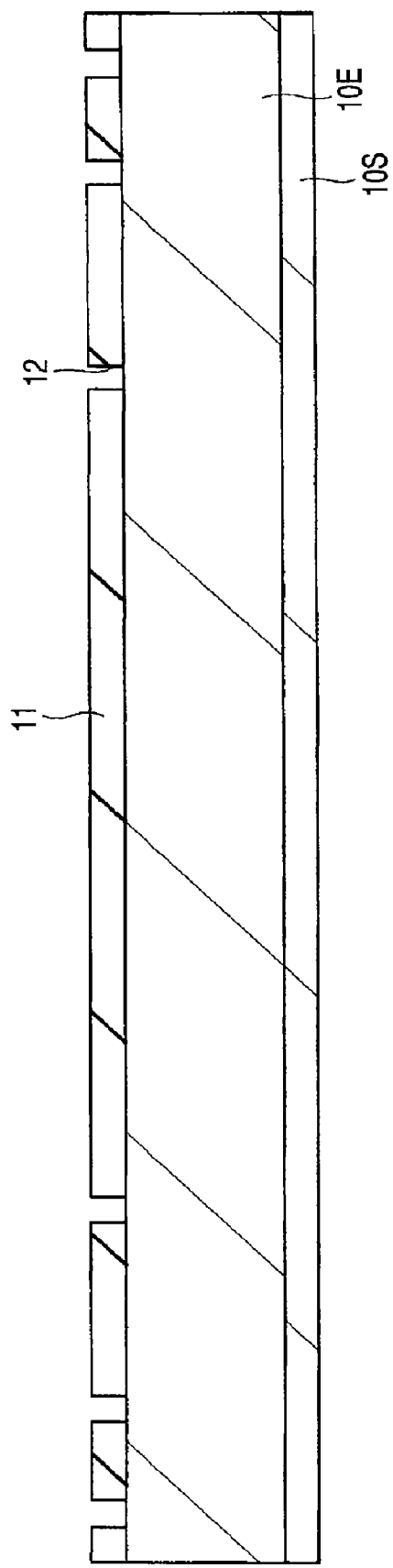
FIG. 46 is a cross-sectional view illustrating a manufacturing process of the semiconductor device subsequent to the manufacturing process shown in FIG. 45.
Figure 47:
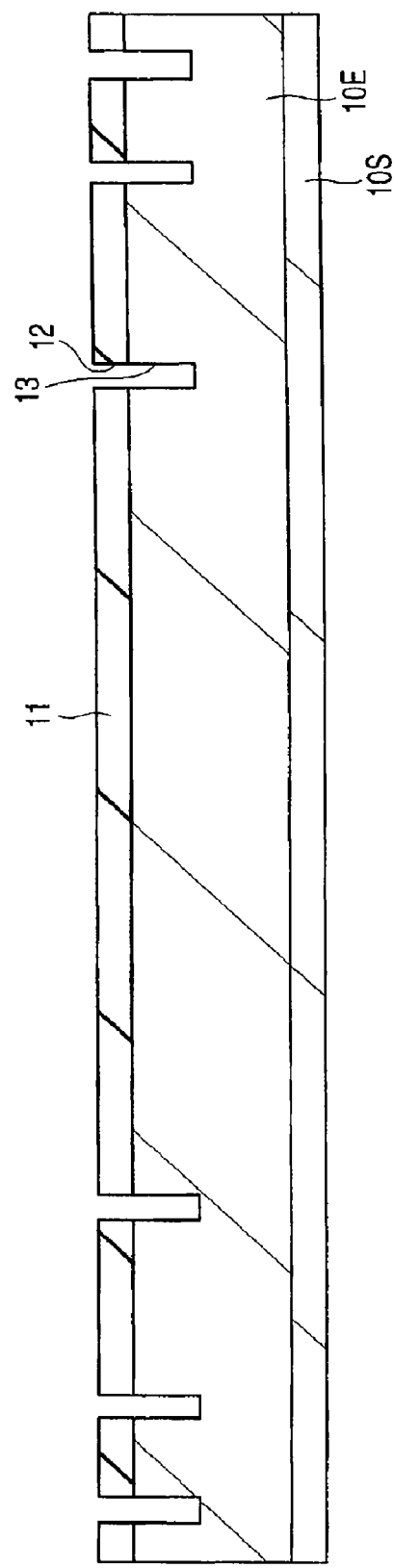
FIG. 47 is a cross-sectional view illustrating a manufacturing process of the semiconductor device subsequent to the manufacturing process shown in FIG. 46.

Subsequently, as shown in FIG. 46, the insulating film 11 is patterned to form openings 12, using a photolithography technique and an etching technique. Then, as shown in FIG. 47, the gate trenches 13 are formed in the semiconductor substrate 10S, using as a mask the insulating film 11 in which the openings 12 have been formed. The gate trenches 13 are formed by, for example, dry etching.

Figure 48:
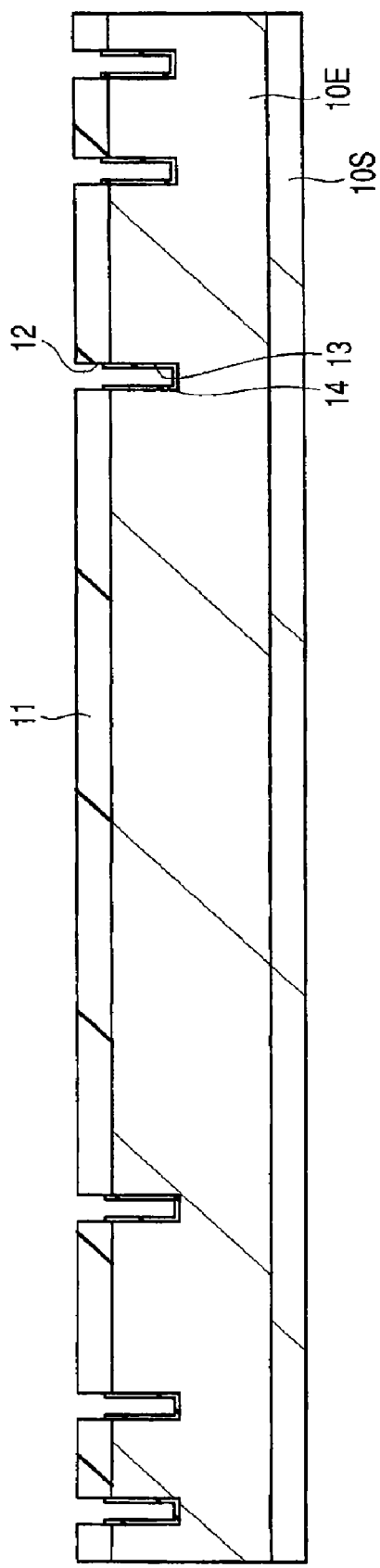
FIG. 48 is a cross-sectional view illustrating a manufacturing process of the semiconductor device subsequent to the manufacturing process shown in FIG. 47.

Next, as shown in FIG. 48, the gate insulating film 14 is formed over the inner wall of each of the gate trenches 13. This gate insulating film 14 is formed of, for example, a silicon oxide film, and can be formed by, for example, a thermal oxidation technique.

Figure 49:
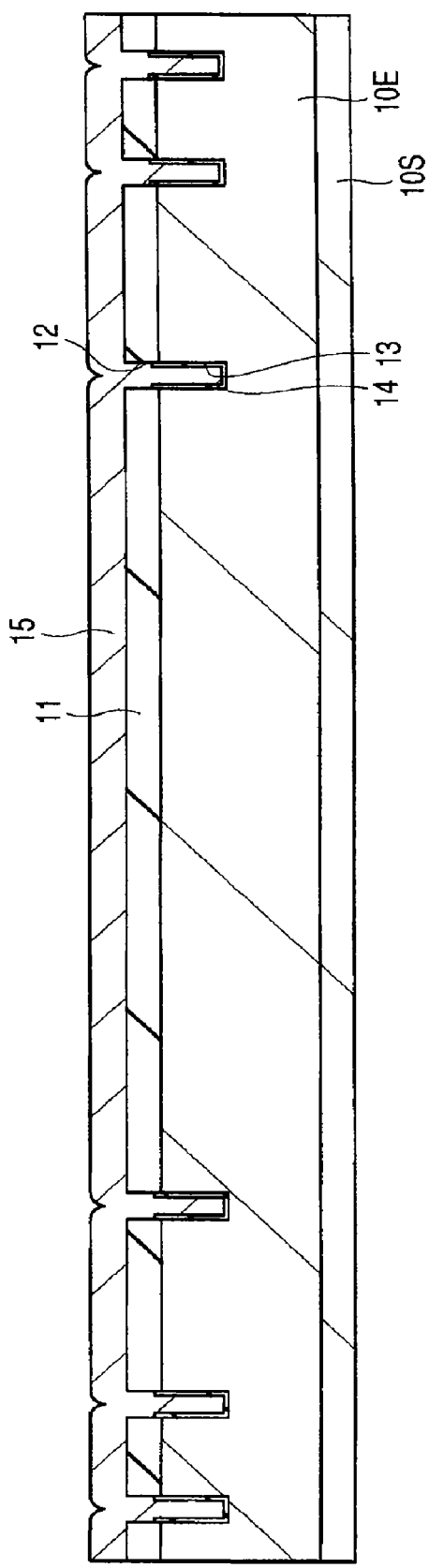
FIG. 49 is a cross-sectional view illustrating a manufacturing process of the semiconductor device subsequent to the manufacturing process shown in FIG. 48.
Figure 50:
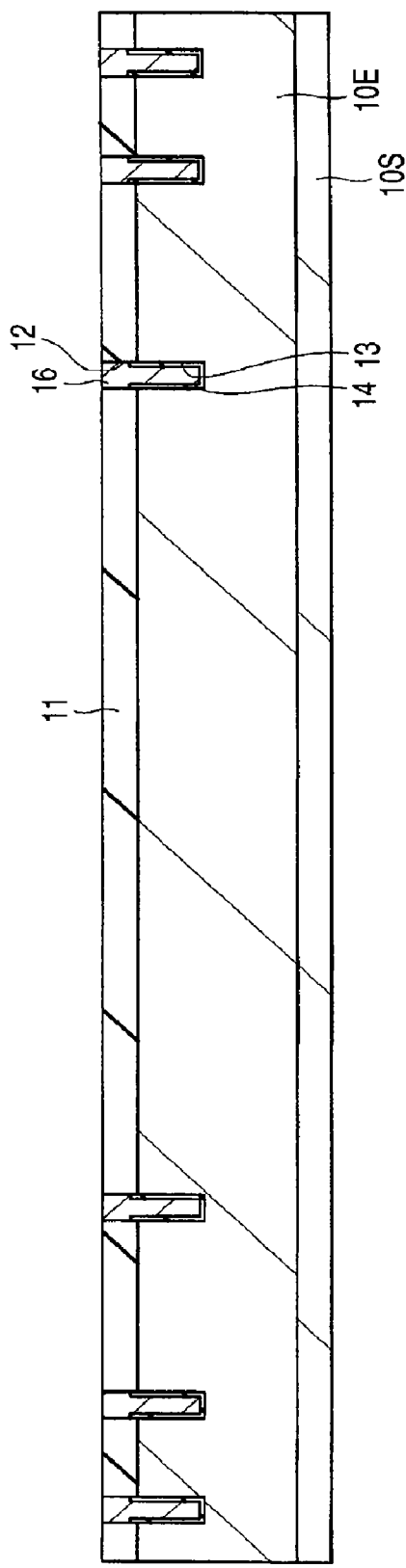
FIG. 50 is a cross-sectional view illustrating a manufacturing process of the semiconductor device subsequent to the manufacturing process shown in FIG. 49.

Next, as shown in FIG. 49, the polysilicon film 15 is formed over the insulating film 11. At this time, the polysilicon film 15 is formed so as to fill the interior of the gate trenches 13. An n-type impurity such as phosphorus (P) or arsenic (As) is added to the polysilicon film 15, and the polysilicon film 15 may be formed using, for example, a CVD (Chemical Vapor Deposition) technique. Subsequently, as shown in FIG. 50, the polysilicon film 15 formed over the insulating film 11 is removed by polishing using a chemical mechanical polishing (CMP) technique. Thereby, the polysilicon film 15 remains only in the interior of the openings 12 and the gate trenches 13 provided in the insulating film 11. Thus, the gate electrodes 16 are formed.

Figure 51:
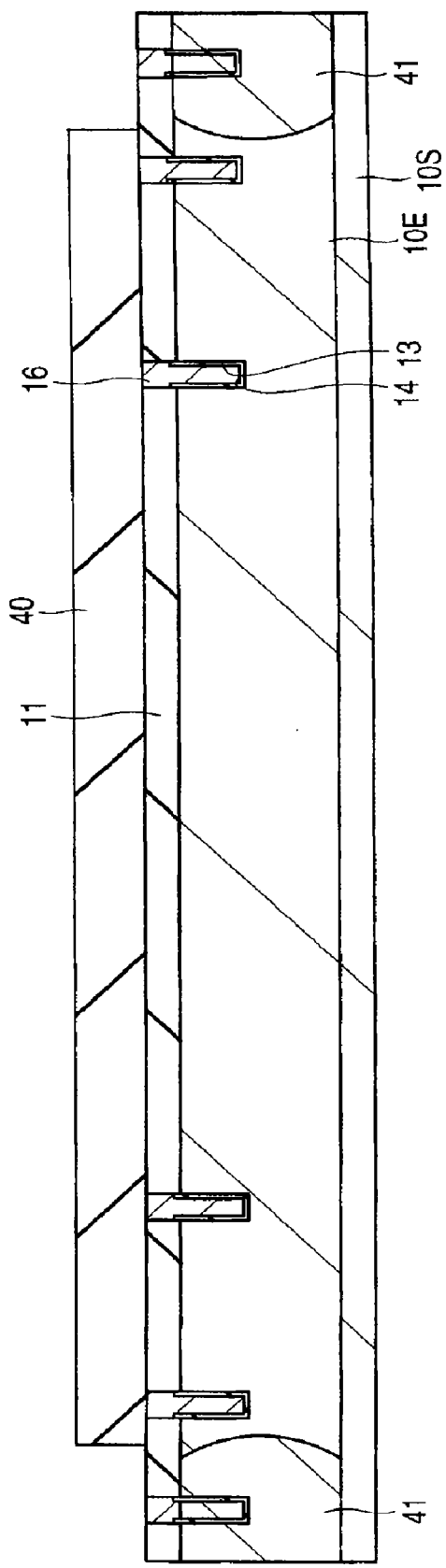
FIG. 51 is a cross-sectional view illustrating a manufacturing process of the semiconductor device subsequent to the manufacturing process shown in FIG. 50.

Next, as shown in FIG. 51, a resist film 40 is applied over the semiconductor substrate 10S using, for example, a spin coating technique. Then, the resist film is patterned by performing exposure and development processes. The patterning is performed so that the region where the Schottky barrier diode is to be formed should be covered while the cell region of the power MISFET should be opened. Then, an n-type impurity is implanted into the cell region of the power MISFET by an ion implantation technique using the patterned resist film 40 as a mask, to form the n-type semiconductor region 41. This n-type semiconductor region 41 is doped with an n-type impurity at a higher concentration than the n-type semiconductor region 10E. This n-type semiconductor region 41 is formed for the following reason. Specifically, in the third preferred embodiment, the impurity concentration of the n-type semiconductor region 10E is lowered in order to form the Schottky barrier diode. This n-type semiconductor region 10E is formed not only in the Schottky barrier diode forming region but also in the cell region of the power MISFET. If this n-type semiconductor region 10E with a low impurity concentration is used as the drain region of the power MISFET as it is, it is believed that the on-state resistance increases due to the low concentration. In view of this, in the third preferred embodiment, the n-type semiconductor region 41 with a higher impurity concentration than the n-type semiconductor region 10E is formed in the cell region of the power MISFET. By using the n-type semiconductor region 41 with a high impurity concentration as the drain region of the power MISFET, the on-state resistance can be reduced. That is, by forming the n-type semiconductor region 10E and the n-type semiconductor region 41, the third preferred embodiment makes it possible to form the cathode of the Schottky barrier diode and at the same time to form the drain region of the power MISFET capable of reducing the on-state resistance.

Figure 52:
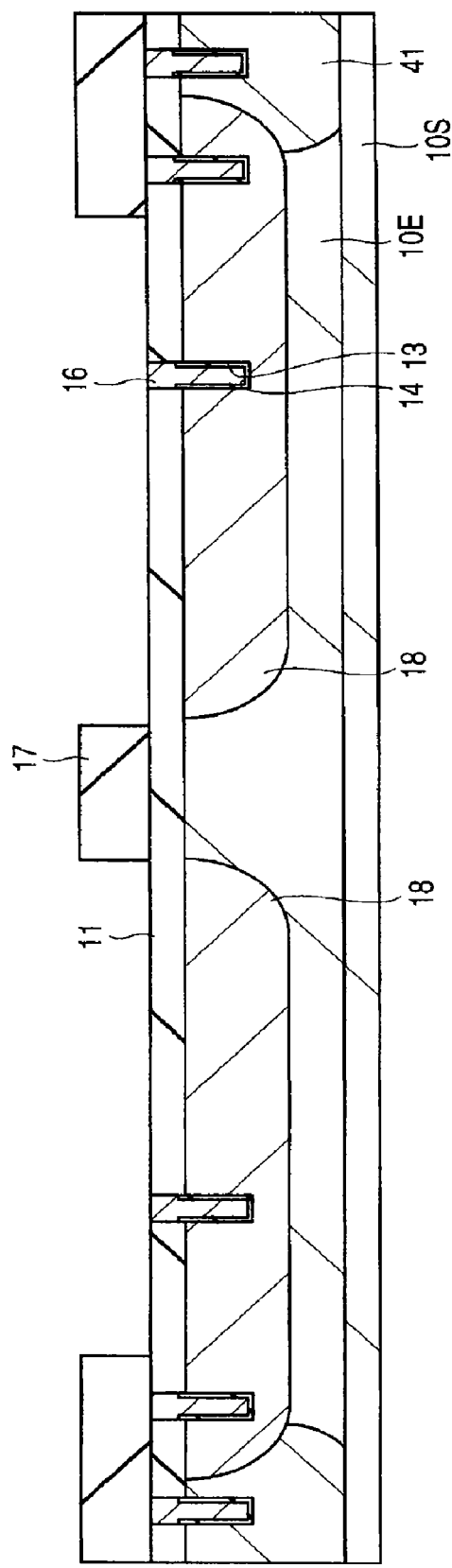
FIG. 52 is a cross-sectional view illustrating a manufacturing process of the semiconductor device subsequent to the manufacturing process shown in FIG. 51.

Subsequently, as shown in FIG. 52, a resist film 17 is applied, and thereafter, exposure and development processes are performed to pattern the resist film 17. The patterning is conducted so as to form openings in the regions where the p-type wells 18 are to be formed. Specifically, the resist film is patterned so as to open portions of the gate wire extension region and the cell region (inactive cell). Then, a p-type impurity such as boron (B) is ion-implanted using the patterned resist film 17 as a mask, whereby the p-type wells 18 are formed.

Figure 53:
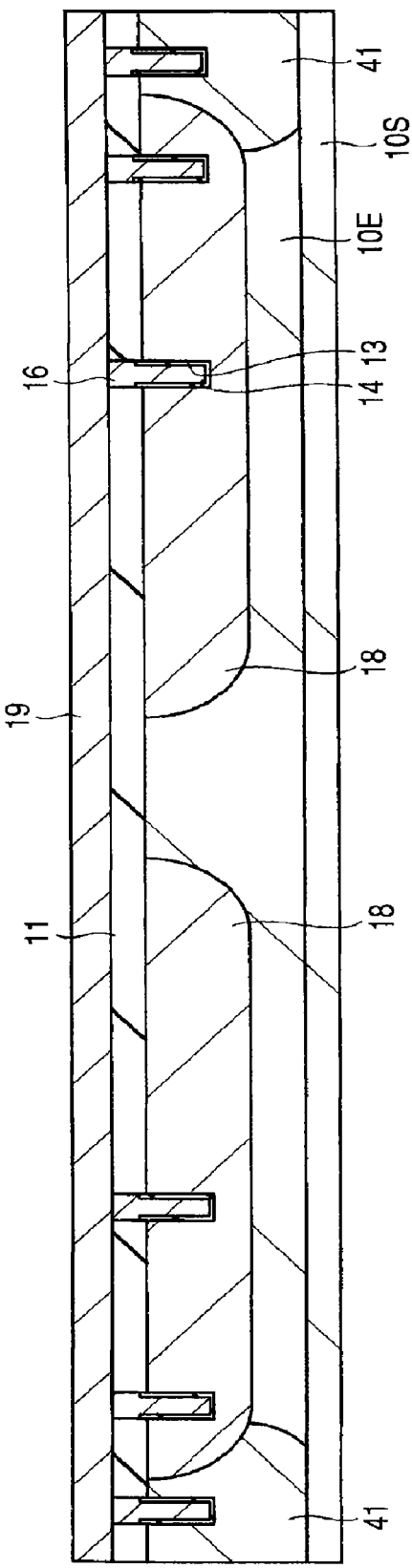
FIG. 53 is a cross-sectional view illustrating a manufacturing process of the semiconductor device subsequent to the manufacturing process shown in FIG. 52.
Figure 54:
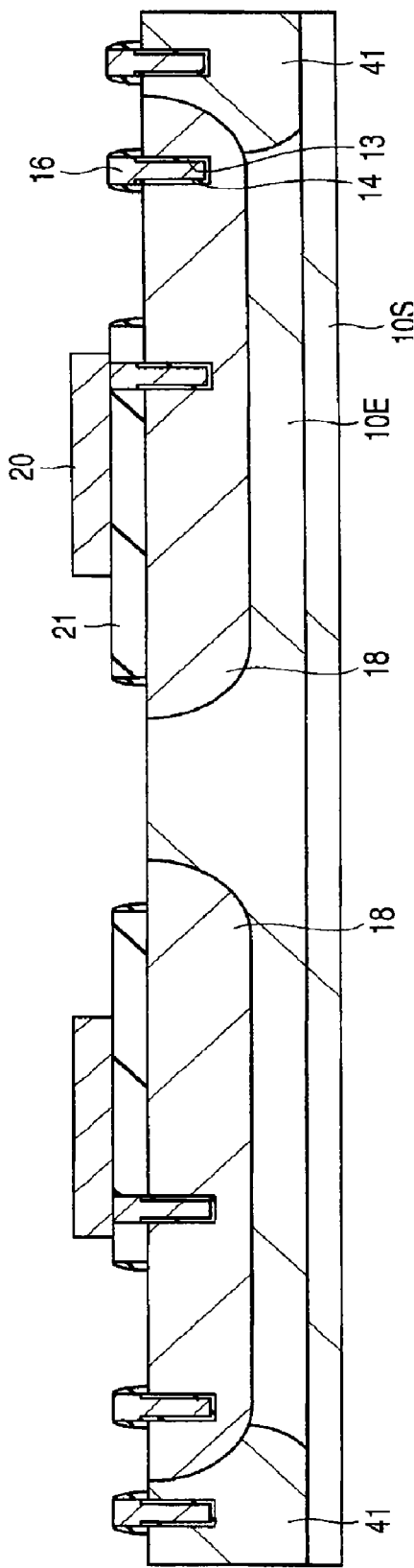
FIG. 54 is a cross-sectional view illustrating a manufacturing process of the semiconductor device subsequent to the manufacturing process shown in FIG. 53.

Next, as shown in FIG. 53, the polysilicon film 19 is formed over the insulating film 11 including the gate electrodes 16. An n-type impurity such as phosphorus or arsenic is added to the polysilicon film 19, and the polysilicon film 19 may be formed using, for example, a CVD technique. Then, as shown in FIG. 54, the polysilicon film 19 is patterned using a photolithography technique and an etching technique. Thereby, the gate extension electrode 20 can be formed in the gate wire extension region. Further, the insulating film 11 is patterned using a photolithography technique and an etching technique. The insulating film 11 that is formed in the cell region (inactive cell) and in the cell region (active cell) is removed through this patterning. As a result, each of the gate electrodes 16 forms such a shape that a portion thereof protrudes from the semiconductor substrate 10S. In other words, a gate electrode 16 a portion of which protrudes from the semiconductor substrate 10S can be formed through the step of removing the insulating film 11. On the other hand, the insulating film 11 is patterned to remain in the gate wire extension region, and as a result, the insulating film 21 remains below the gate extension electrode 20.

Figure 55:
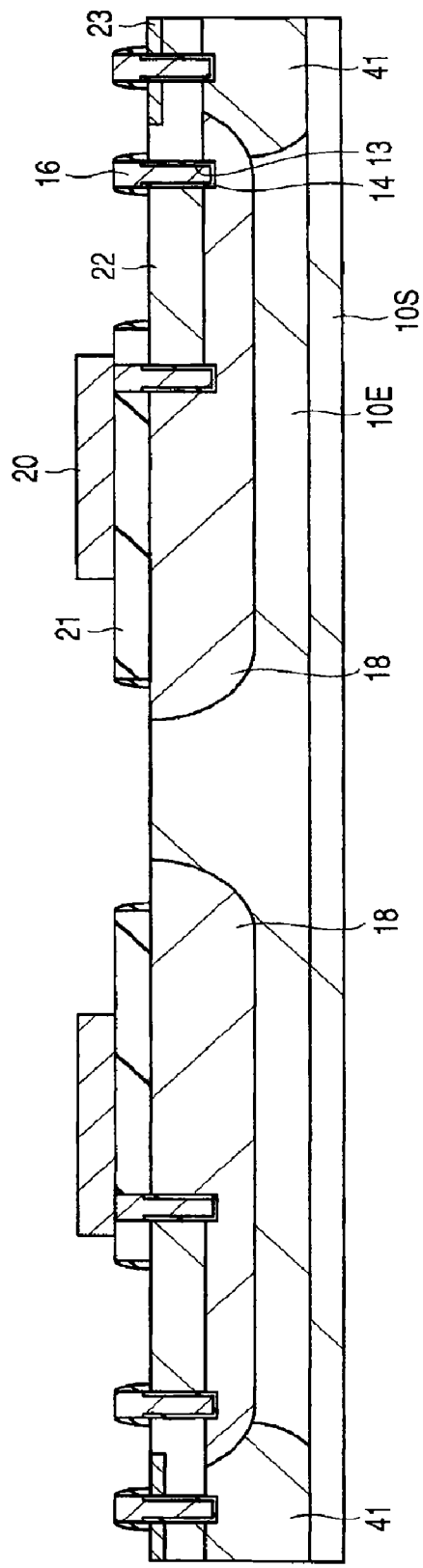
FIG. 55 is a cross-sectional view illustrating a manufacturing process of the semiconductor device subsequent to the manufacturing process shown in FIG. 54.

Subsequently, as shown in FIG. 55, the channel forming region 22, which becomes the body region, is formed in the semiconductor substrate 10S within the cell region (inactive cell) and the cell region (active cell) using a photolithography technique and an etching technique. This channel forming region 22 is a p-type semiconductor region doped with a p-type impurity such as boron. Then, the source region 23 is formed in the cell region (active cell) using a photolithography technique and an ion implantation technique. The source region 23 is formed in a region adjacent to the gate electrode 16. The source region 23 is an n-type semiconductor region doped with an n-type impurity such as arsenic.

Figure 56:
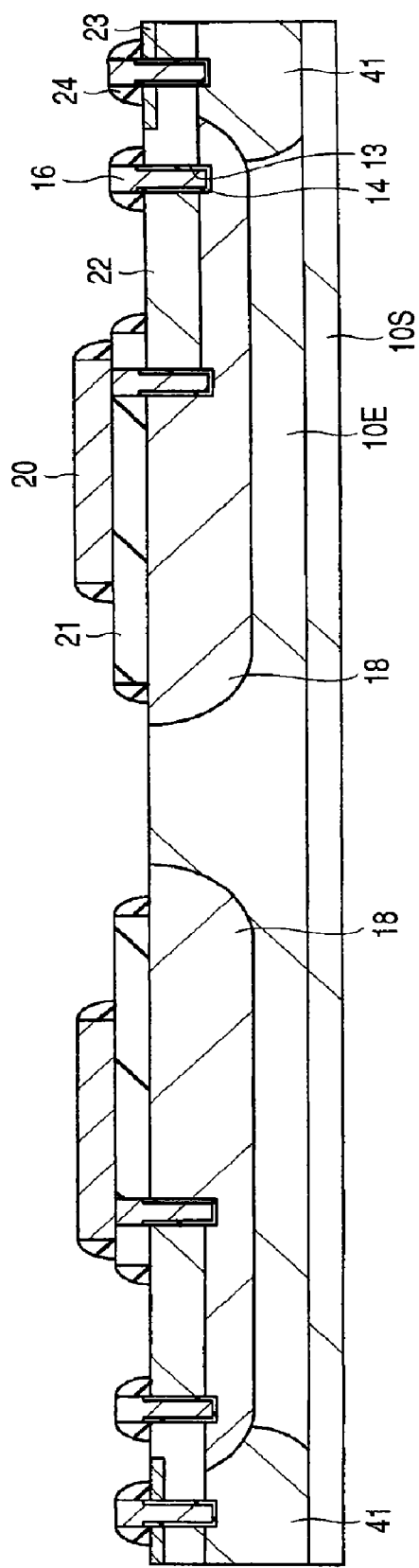
FIG. 56 is a cross-sectional view illustrating a manufacturing process of the semiconductor device subsequent to the manufacturing process shown in FIG. 55.

Then, as shown in FIG. 56, a silicon oxide film (second insulating film) is formed over the semiconductor substrate 10S using, for example, a CVD technique and thereafter, by subjecting the formed silicon oxide film to anisotropic dry etching, sidewalls 24 are formed on side wall portions of the gate electrodes 16. Since portions of the gate electrodes 16 protrude from the semiconductor substrate 10S, the sidewalls 24 are formed on the side wall portions of the protruding portions.

Figure 57:
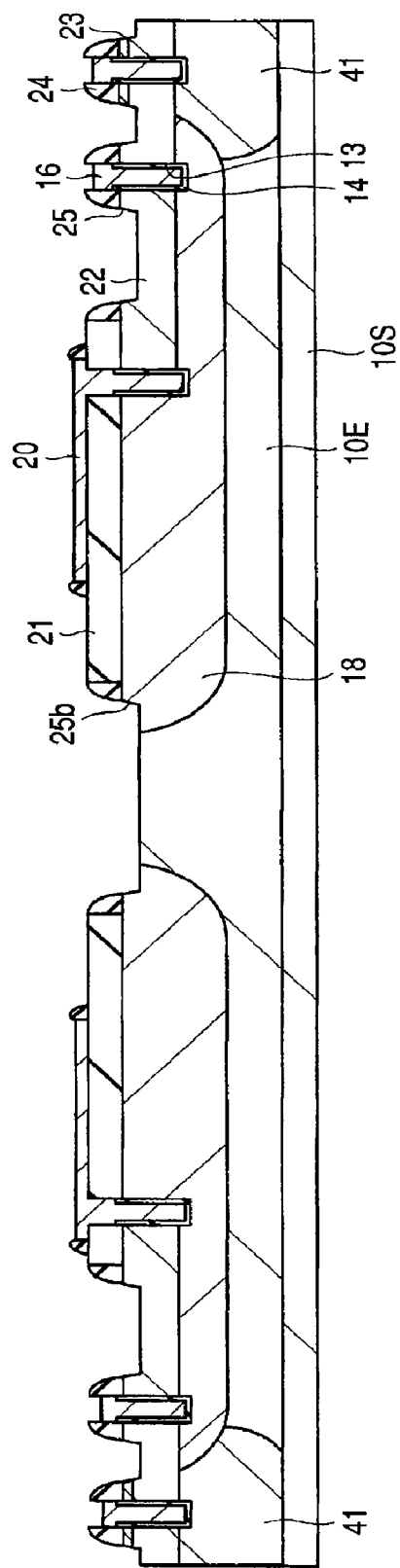
FIG. 57 is a cross-sectional view illustrating a manufacturing process of the semiconductor device subsequent to the manufacturing process shown in FIG. 56.

Next, as shown in FIG. 57, using the sidewalls 24 as a mask, a body trench 25 that is deeper than the depth of the adjacent source region 23 is formed. Specifically, the body trench 25 self-aligned with the adjacent gate electrodes 16 is formed between the sidewalls 24 formed over the side wall portions of the adjacent gate electrodes 16. In this way, according to the third preferred embodiment, it becomes possible to eliminate the limitation arising from the problem of alignment accuracy and to reduce the occupied area by a unit cell, because the body trench 25 is formed without using a photolithography technique.

Here, the body trench 25 has been formed by self-alignment with the gate electrodes 16, and in the same process steps, the junction groove 25b is formed in the SBD junction portion. This junction groove 25b is also formed by self-alignment with sidewall 24. The junction groove 25b is so formed that the width thereof will be wider than the body trench 25 but the depth will be about the same. The Schottky junction of the Schottky barrier diode is formed in the surface of the junction groove 25b, as will be described later. It may seem, however, that it is not necessary to form the junction groove 25b in the region where the Schottky junction of the Schottky barrier diode is to be formed. That is, it may seem possible to form the junction portion over the surface (flat surface region) of the semiconductor substrate 10S (n-type semiconductor region 10E) in which the junction groove 25b is not formed. However, the semiconductor substrate 10S is subjected to various annealing processes in the prior manufacturing steps. Especially when forming the insulating film 11 among the anneal processes, phosphorus implanted in the n-type semiconductor region 10E segregates near the surface of the n-type semiconductor region 10E. Consequently, when the Schottky junction is formed in the surface of the n-type semiconductor region 10E, the withstand voltage of the Schottky barrier diode degrades because the impurity concentration has been increased by the segregated phosphorus. In view of this, in the third preferred embodiment, the junction groove 25b is formed in the surface of the n-type semiconductor region 10E. By forming the junction groove 25b in this way, the phosphorus segregated near the surface of the n-type semiconductor region 10E can be removed. In other words, the adverse effect originating from the segregated phosphorus can be prevented by forming the Schottky junction in the surface of the junction groove 25b. Therefore, the Schottky barrier diode can achieve a high withstand voltage.

Figure 58:
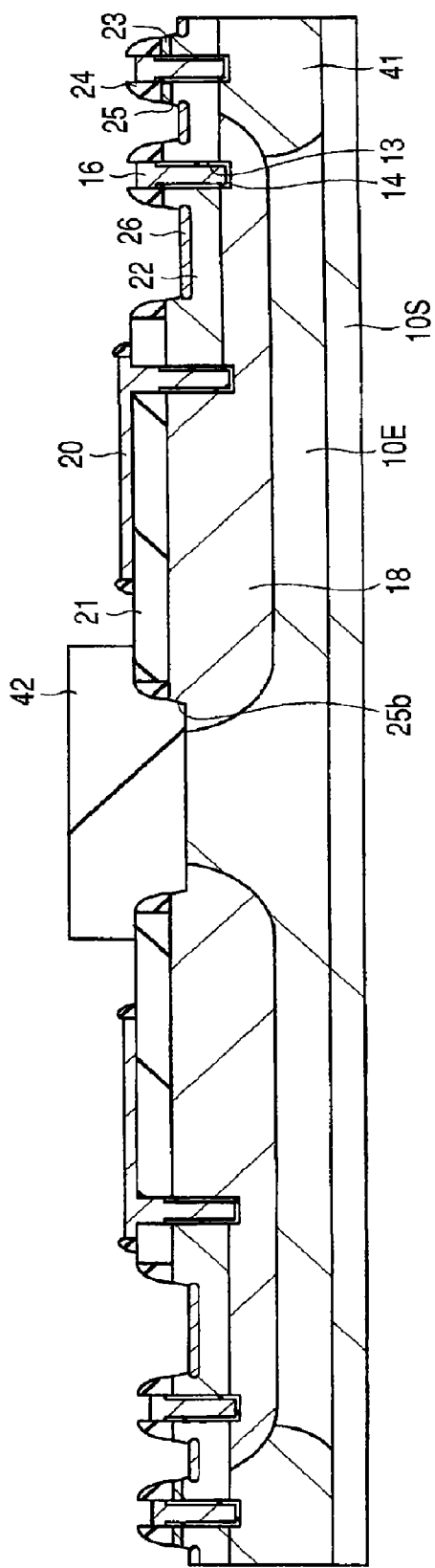
FIG. 58 is a cross-sectional view illustrating a manufacturing process of the semiconductor device subsequent to the manufacturing process shown in FIG. 57.

Subsequently, as shown in FIG. 58, a resist film 42 is applied over the semiconductor substrate 10S, and thereafter, the resist film 42 is patterned by exposure and development processes. The patterning is carried out so that only the SBD junction portion will be covered and the rest of the regions will be exposed. Then, using the patterned resist film 42 as a mask, a p-type impurity such as boron fluoride is implanted over the entire surface of the main surface (element forming surface) of the semiconductor substrate 10S. Thereby, a body contact region 26 (first semiconductor region) is formed at a bottom portion of the body trench 25. The body contact region 26 is a p-type semiconductor region doped with the p-type impurity at a higher concentration than in the channel forming region 22. This body contact region 26 is formed by implanting the p-type impurity over the entire surface of the semiconductor substrate 10S without using a photolithography technique. Therefore, the body contact region 26 can be formed without being restricted by the problem of alignment accuracy in the originating from the photolithography technique.

In this step, the Schottky junction portion is covered and protected by the resist film 42 so that the p-type impurity will not be introduced in the surface of the junction groove 25b. This is to prevent the surface of the junction groove 25b from being doped with the p-type impurity and from forming a pn junction.

Figure 59:
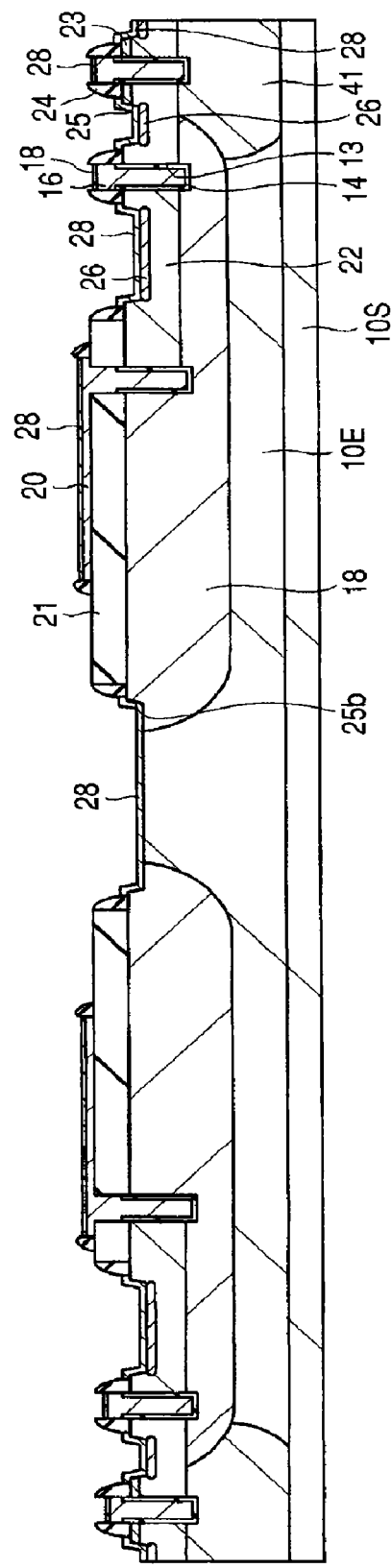
FIG. 59 is a cross-sectional view illustrating a manufacturing process of the semiconductor device subsequent to the manufacturing process shown in FIG. 58.

Next, as shown in FIG. 59, a cobalt film is formed over the entire surface of the main surface of the semiconductor substrate 10S using, for example, a sputtering technique. Thereafter, by annealing the semiconductor substrate 10S, a cobalt silicide film 28 (first metal silicide film) is formed over the surfaces of the gate electrode 16, the gate extension electrode 20, the body trench 25, and the junction groove 25b. Specifically, silicon and the cobalt film are directly in contact with each other at the surfaces of the gate electrode 16, the gate extension electrode 20, the body trench 25, and the junction groove 25b, and therefore, the silicon and the cobalt film react with each other by the annealing, forming the cobalt silicide film 28. In this way, the cobalt silicide film 28 can be formed over the gate electrode 16. Therefore, it is possible to suppress the increase in the gate resistance of the gate electrode 16 because of the shrinkage of the gate trench 13, which is associated with miniaturization.

In this step, the Schottky junction is formed over the surface of the junction groove 25b and the Schottky barrier diode is formed. In other words, a Schottky barrier diode comprising the n-type semiconductor region 10E as the cathode region and the cobalt silicide film 28 as the anode region is formed. Here, in the third preferred embodiment, the cobalt silicide film 28 is formed over the gate electrode 16, the gate extension electrode 20, and the body trench 25 of the power MISFET and at the same time, the cobalt silicide film (second metal silicide film) is formed over the surface of the junction groove 25b. Thereby, the power MISFET similar to the first preferred embodiment and the Schottky barrier diode can be formed at one silicide process step.

The subsequent process steps are the same as described in the first preferred embodiment. Thus, it is possible to manufacture a semiconductor device in which the power MISFET and the Schottky barrier diode are incorporated together in a single semiconductor chip.

The features of the third preferred embodiment may be summarized as follows. That is, one of the differences from the manufacturing method of the semiconductor device according to the first preferred embodiment is that the low-concentration n-type semiconductor region 10E is formed. This is necessary for fabricating the Schottky barrier diode. Next, the second difference is that the n-type semiconductor region 41 doped with an impurity at a higher concentration than the n-type semiconductor region 10E is formed in the cell region of the power MISFET. This is necessary for reducing the on-state resistance of the power MISFET. Further, the third difference is that the body contact region 26 of the power MISFET is formed in the state that the resist film 42 has been formed over the junction groove 25b formed in the SBD junction portion. This is necessary for preventing the p-type impurity from being introduced in the Schottky junction formed over the surface of the junction groove 25b. By adding these features, the third preferred embodiment makes it possible to incorporate the Schottky diode, formed in the Schottky junction formed by the cobalt silicide film 28 and the n-type semiconductor region 10E, in one semiconductor chip while reducing the on-state resistance of the power MISFET. Moreover, since the Schottky junction is formed in the surface of the junction groove 25b, the adverse effects from the phosphorus segregated to the surface of the n-type semiconductor region 10E during the annealing step can be eliminated. Therefore, it becomes possible to improve the withstand voltage of the Schottky barrier diode.

(Fourth Preferred Embodiment) A fourth preferred embodiment describes an example of a semiconductor device capable of reducing the feedback capacitance between the gate electrode and the drain region in a power MISFET.

The feedback capacitance of the power MISFET having a gate trench structure corresponds to the capacitance between the drain region (the semiconductor substrate 10) and the portion of the gate electrode 16 protruding from the channel forming region 22. By the structure according to the first preferred embodiment, the power MISFET can be miniaturized and the device density can be increased. However, as the miniaturization of the power MISFET is advanced, the cell density increases, and as a consequence, the side effect of feedback capacitance increase per unit area occurs. The increase in feedback capacitance leads to an increase in switching loss of the power MISFET, resulting in degradation in the efficiency of the system. In view of this, the fourth preferred embodiment describes a configuration that employs the configuration of the foregoing first preferred embodiment and moreover that is capable of reducing the feedback capacitance between the gate electrode and the drain region in a power MISFET.

Figure 60:
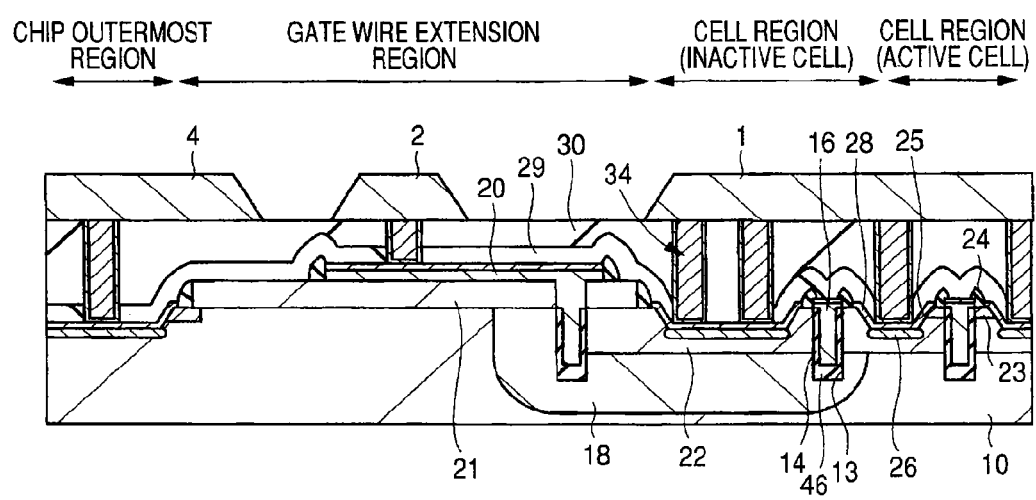
FIG. 60 is a cross-sectional view illustrating a semiconductor device according to a fourth preferred embodiment.

FIG. 60 is a cross-sectional view illustrating a cross section of a power MISFET according to the fourth preferred embodiment. In FIG. 60, most of the structure is the same as that in the foregoing first preferred embodiment. A difference is that the film thickness of the silicon oxide film 46 formed over the bottom portion of the gate trench 13 is made thicker than the film thickness of the gate insulating film 14 formed over the side surface of the gate trench 13. This configuration makes it possible to increase the distance between the gate electrode 16 and the drain region (the semiconductor substrate 10) and can therefore reduce the feedback capacitance. As a result, when the power MISFET according to the fourth preferred embodiment is applied to the main-switch power MISFET in the DC/DC converter described in the foregoing third preferred embodiment, the switching loss can be reduced. On the other hand, when the power MISFET according to the fourth preferred embodiment is applied to the synchronous rectifying power MISFET, it is possible to suppress the self-turn-on phenomenon, which occurs when (feedback capacitance (gate-drain capacitance)/input capacitance (gate-source capacitance)) becomes large. By increasing the film thickness of the insulating film 40 formed over the bottom portion of the gate trench 13 in this way, the efficiency of the DC/DC converter can be improved.

Next, a manufacturing method of a power MISFET according to the fourth preferred embodiment is described with reference to the drawings.

Figure 61:
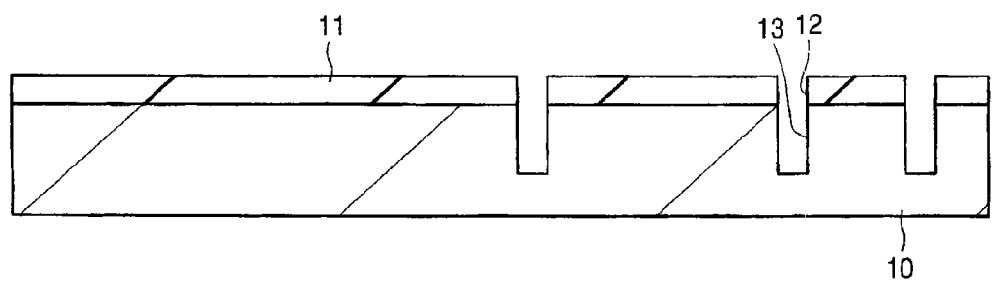
FIG. 61 is a cross-sectional view illustrating a manufacturing process of the semiconductor device according to the fourth preferred embodiment.

As shown in FIG. 61, using an epitaxial growth technique, an n-type epitaxial layer is formed over the semiconductor substrate 10 doped with an n-type impurity. In the fourth preferred embodiment, the semiconductor substrate 10 doped with an n-type impurity and the n-type epitaxial layer are collectively referred to as a semiconductor substrate 10. The insulating film 11 (the first insulating film) is formed over the semiconductor substrate 10 using, for example, a thermal oxidation technique. This insulating film 11 is formed of, for example, a silicon oxide film.

Subsequently, the insulating film 11 is patterned to form openings 12, using a photolithography technique and an etching technique. Then, the gate trenches 13 are formed in the semiconductor substrate 10, using as a mask the insulating film 11 in which the openings 12 have been formed. The gate trenches 13 are formed by, for example, dry etching.

Figure 62:
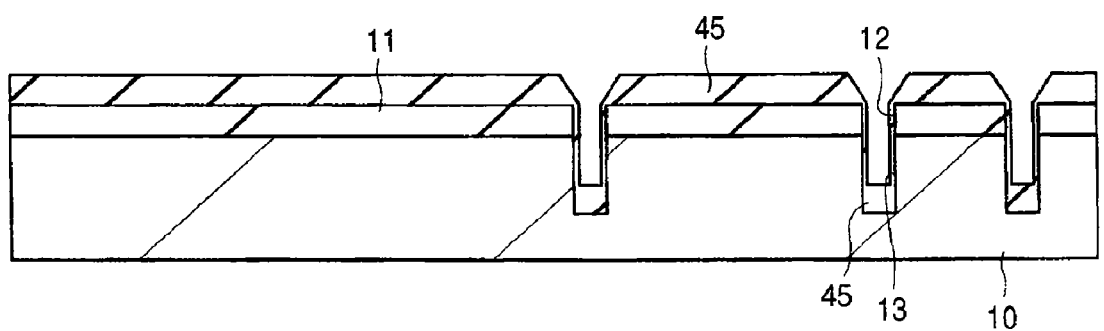
FIG. 62 is a cross-sectional view illustrating a manufacturing process of the semiconductor device subsequent to the manufacturing process shown in FIG. 61.

Next, as shown in FIG. 62, a silicon oxide film 45 is formed over the semiconductor substrate 10 in which the gate trenches 13 have been formed. One of the features of the invention is that high density plasma chemical vapor deposition (HDP-CVD) is used to form the silicon oxide film 45. The high density plasma CVD is a method in which a source gas introduced into the chamber and turned into plasma using a high-frequency electric field or magnetic field is used to perform film formation. Specific examples of the method for generating high density plasma include an inductively-coupled plasma method (ICP) and electron cyclotron resonance (ECR). The inductively-coupled plasma method is a film formation method using one type of high density plasma that is used in chemical vapor deposition or the like. It uses a plasma generated by exciting a gas introduced in the chamber with a inductively-coupled high-frequency coil to form a film. The electron cyclotron resonance technique is as follows. When an electron receives a Lorentz force, the electron performs cyclotron motion, in which the electron orbits within a plane perpendicular to a magnetic field. At this time, when applying an electric field that matches the frequency of orbiting of the electron within the plane of the motion of the election, energy resonance occurs between the cyclotron motion and the electric field, and the energy of the electric field is absorbed by the electron. The method that utilizes this phenomenon to turn various gases into plasma and performs film formation is the electron cyclotron resonance technique.

A feature of the high density plasma CVD is that the film deposition advances while the sputtering etching phenomenon takes place for the film. Therefore, when the gate trench 13 is filled by the high density plasma CVD, a thick silicon oxide film 45 is formed over a bottom portion of the gate trench 13 while a thin silicon oxide film 45 is formed over the side surface of the gate trench 13. Thus, as shown in FIG. 62, it is possible to form the silicon oxide film 45 with a large film thickness over the bottom portion of the gate trench 13.

Figure 63:
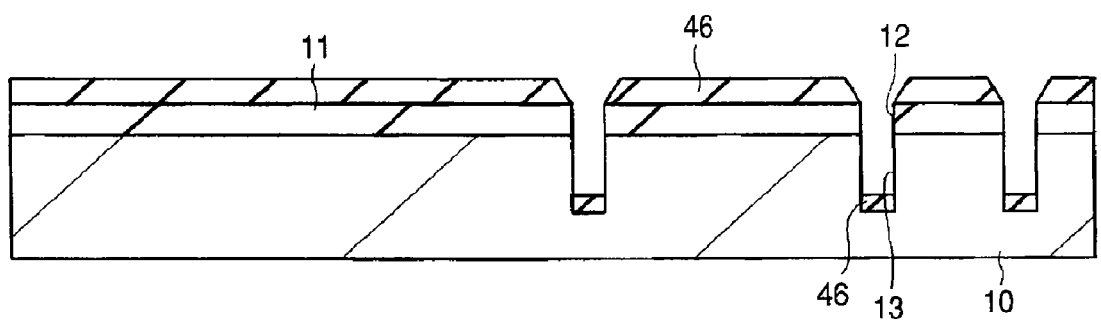
FIG. 63 is a cross-sectional view illustrating a manufacturing process of the semiconductor device subsequent to the manufacturing process shown in FIG. 62.

Thereafter, wet etching is performed as shown in FIG. 63. The etch amount in this wet etching is set at an etch amount such that the silicon oxide film 45 over the side surface can be completely removed. At this time, the silicon oxide film 46 with a larger film thickness than that over the side surface is formed over the bottom portion of the gate trench 13, so the silicon oxide film 46 with a larger film thickness is left unetched. In this way, utilizing a feature of high density plasma CVD, the silicon oxide film 46 with a large film thickness can be formed over the bottom portion of the gate trench 13 in a simple manner.

Subsequently, as shown in FIG. 8 of the foregoing first preferred embodiment, the gate insulating film is formed over the side surface of each of the gate trenches 13. The subsequent process steps are the same as described in the first preferred embodiment. The power MISFET according to the fourth preferred embodiment can be formed in this manner.

While the invention has been shown and described in detail, the foregoing description is in all aspects illustrative and not restrictive. It is therefore understood that numerous other modifications and variations can be devised without departing from the scope of the invention.

Although the foregoing description of the preferred embodiments has described power MISFETs having a trench gate structure, the invention is also applicable to, for example, IGBTs (Insulated Gate Bipolar Transistors) having a trench gate structure.

The present invention can be widely used in the industries of manufacturing semiconductor devices.

What is claimed is:

1. A semiconductor device comprising:
  (a) a semiconductor substrate of a first conductivity type;
  (b) a gate trench formed in a main surface of the semiconductor substrate;
  (c) a gate insulating film formed over an inner wall and a bottom portion of the gate trench;
  (d) a gate electrode formed so as to fill the gate trench and a portion of which protrudes from the semiconductor substrate;
  (e) a sidewall formed over a side wall portion of the gate electrode protruding from the semiconductor substrate;
  (f) a source region of the first conductivity type, formed so as to be adjacent to the gate electrode;

(g) a body trench formed between the sidewalls formed on adjacent gate electrodes by self-alignment with the gate electrodes, so as to be deeper than a depth of the source region;

(h) a first semiconductor region formed at a bottom portion of the body trench and having a second conductivity type that is different from the first conductivity type;

(i) a drain region of the first conductivity type, formed in an opposite surface to the main surface of the semiconductor substrate; and (j) a first metal silicide film formed over the gate electrode, the source region, and the first semiconductor region, wherein the source region and the first semiconductor region are electrically coupled to each other by the first metal silicide film.

2. The semiconductor device according to claim 1, wherein the height of an uppermost portion of the sidewall is higher than the height of an uppermost portion of the gate electrode.

3. The semiconductor device according to claim 1, wherein: a Schottky barrier diode is formed over the semiconductor substrate; the Schottky barrier diode has a junction formed by the semiconductor substrate and a second metal silicide film formed over the semiconductor substrate; and the second metal silicide film and the first metal silicide film are formed at the same time.

4. The semiconductor device according to claim 3, wherein: the Schottky barrier diode has a junction groove formed in the semiconductor substrate; and the second metal silicide film is formed in the junction groove.

5. A semiconductor device comprising:
(a) a semiconductor substrate of a first conductivity type;
(b) a gate trench formed in a main surface of the semiconductor substrate;
(c) a gate insulating film formed over an inner wall and a bottom portion of the gate trench;
(d) a gate electrode formed so as to fill the gate trench and a portion of which protrudes from the semiconductor substrate;
(e) a first source region of the first conductivity type, formed so as to be adjacent to the gate electrode;
(f) a sidewall formed over a side wall portion of the gate electrode protruding from the semiconductor substrate;
(g) a second source region of the first conductivity type, formed so as to be adjacent to the first source region;
(h) a body trench formed between the sidewalls formed on adjacent gate electrodes by self-alignment with the gate electrodes, so as to be deeper than a depth of the second source region;
(i) a first semiconductor region formed at a bottom portion of the body trench and having a second conductivity type that is different from the first conductivity type; and
(j) a drain region of the first conductivity type, formed in an opposite surface to the main surface of the semiconductor substrate, wherein the first source region is formed in a region shallower than the second source region.

* * * * *